US012632088B2

(12) United States Patent
Cho et al.

(10) Patent No.: US 12,632,088 B2
(45) Date of Patent: May 19, 2026

(54) ELECTRONIC DEVICE INCLUDING FLEXIBLE DISPLAY AND METHOD FOR CONTROLLING TEMPERATURE ACCORDING TO STATE OF ELECTRONIC DEVICE USING THE SAME

(71) Applicant: Samsung Electronics Co., Ltd., Suwon-si (KR)

(72) Inventors: Baekeun Cho, Suwon-si (KR); Hyunggwang Kang, Suwon-si (KR); Myunghoon Kwak, Suwon-si (KR); Bohyeon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1228 days.

(21) Appl. No.: 17/521,325

(22) Filed: Nov. 8, 2021

(65) Prior Publication Data

US 2022/0113766 A1    Apr. 14, 2022

Related U.S. Application Data

(63) Continuation of application No. PCT/KR2021/013994, filed on Oct. 12, 2021.

(30) Foreign Application Priority Data

Oct. 12, 2020    (KR) ........................ 10-2020-0131166
Dec. 17, 2020    (KR) ........................ 10-2020-0177420

(51) Int. Cl.
| | |
|---|---|
| *G06F 1/16* | (2006.01) |
| *H04M 1/02* | (2006.01) |
| *H05K 7/20* | (2006.01) |

(52) U.S. Cl.
CPC .......... *G06F 1/1652* (2013.01); *G06F 1/1624* (2013.01); *H05K 7/20954* (2013.01);
(Continued)

(58) Field of Classification Search
CPC .. G06F 1/1624; G06F 1/1652; H04M 1/0237; H04M 1/0241; H04M 1/0268; H04M 2250/12; H05K 7/20954
See application file for complete search history.

(56) References Cited

U.S. PATENT DOCUMENTS

| | | | |
|---|---|---|---|
| 9,983,557 B2 | 5/2018 | Park et al. | |
| 10,234,945 B2 | 3/2019 | Levesque et al. | |

(Continued)

FOREIGN PATENT DOCUMENTS

| | | |
|---|---|---|
| KR | 10-2013-0051569 A | 5/2013 |
| KR | 10-2016-0016181 A | 2/2016 |

(Continued)

OTHER PUBLICATIONS

US 11,212,378 B2, 12/2021, Hong (withdrawn)
(Continued)

*Primary Examiner* — Terrell S Johnson
(74) *Attorney, Agent, or Firm* — Jefferson IP Law, LLP

(57) ABSTRACT

An electronic device is provided. The electronic device includes a housing, a flexible display including a sliding plate and a bendable section, a multi-bar structure supporting the bendable section, a sensor circuit configured to detect a first state in which at least a part of the bendable section enters an internal space of the housing or a second state in which at least a part of the bendable section is drawn out from the housing, at least one temperature sensor, and a processor. The processor obtains a temperature of one or more heating elements through the at least one temperature sensor in the first state, identifies at least one heating element having a temperature higher than a designated temperature, and controls the at least one heating element having the temperature higher than the designated temperature to operate according to a first execution policy.

18 Claims, 17 Drawing Sheets

(52) U.S. Cl.
CPC ........ *H04M 1/0237* (2013.01); *H04M 1/0241* (2013.01); *H04M 1/0268* (2013.01); *H04M 2250/12* (2013.01)

(56) References Cited

U.S. PATENT DOCUMENTS

| | | | |
|---|---|---|---|
| 10,371,584 B2 | 8/2019 | Kim et al. | |
| 11,194,363 B2 | 12/2021 | Kim et al. | |
| 11,366,486 B2 | 6/2022 | Jung et al. | |
| 2012/0314399 A1* | 12/2012 | Bohn | H04M 1/0268 361/679.01 |
| 2020/0363841 A1* | 11/2020 | Kim | G09F 9/301 |
| 2020/0409421 A1 | 12/2020 | Cho et al. | |
| 2021/0165442 A1* | 6/2021 | Jung | G06F 3/0482 |
| 2021/0240294 A1 | 8/2021 | Ko et al. | |

FOREIGN PATENT DOCUMENTS

| | | | |
|---|---|---|---|
| KR | 10-2018-0028968 | A | 3/2018 |
| KR | 10-2019-0062855 | A | 6/2019 |
| KR | 10-2019-0124009 | A | 11/2019 |
| KR | 10-2020-0017260 | A | 2/2020 |
| KR | 10-2020-0077931 | A | 7/2020 |
| KR | 10-2322697 | B1 | 11/2021 |

OTHER PUBLICATIONS

Korean Office Action dated May 1, 2025, issued in Korean Application No. 10-2020-0177420.
International Search Report and Written Opinion dated Jan. 14, 2022, issued in International Patent Application No. PCT/KR2021/013994.

* cited by examiner

FIG. 5B
550
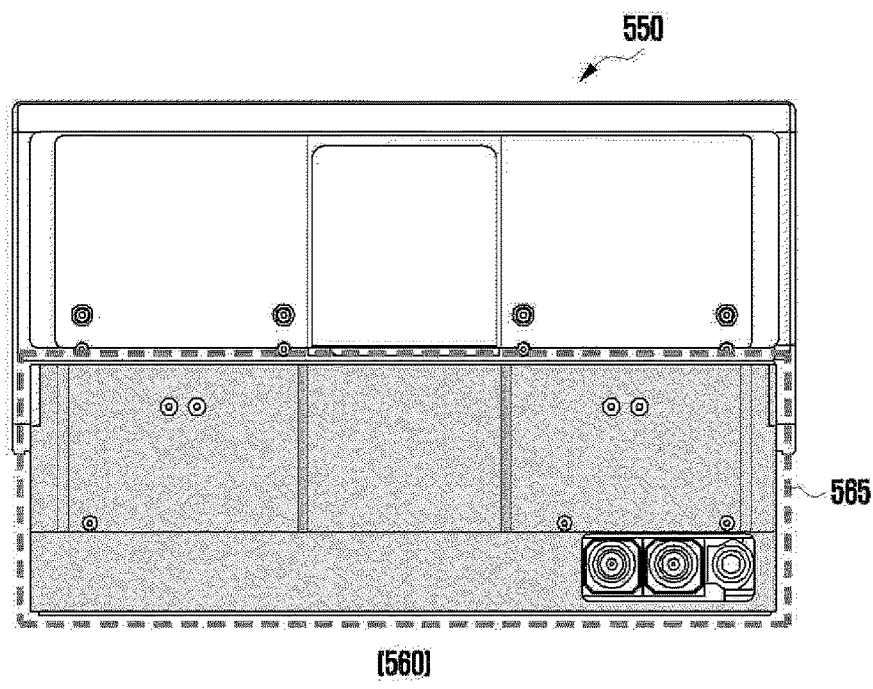
(560)
565
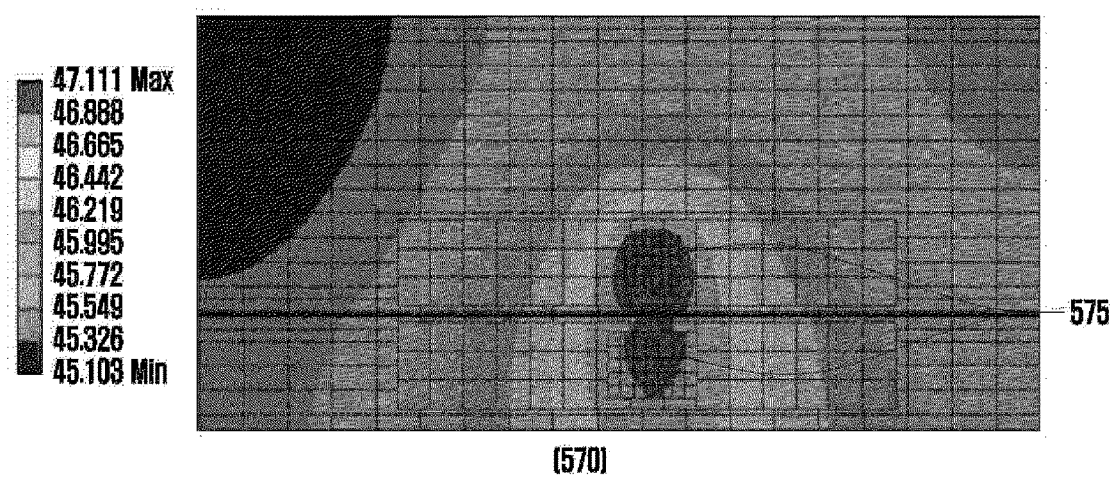
575
(570)
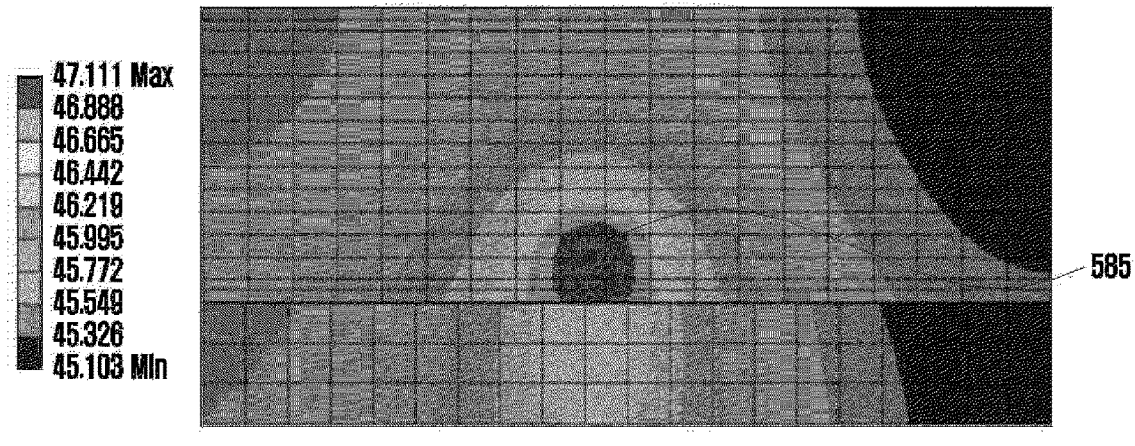
585
(580)

FIG. 7

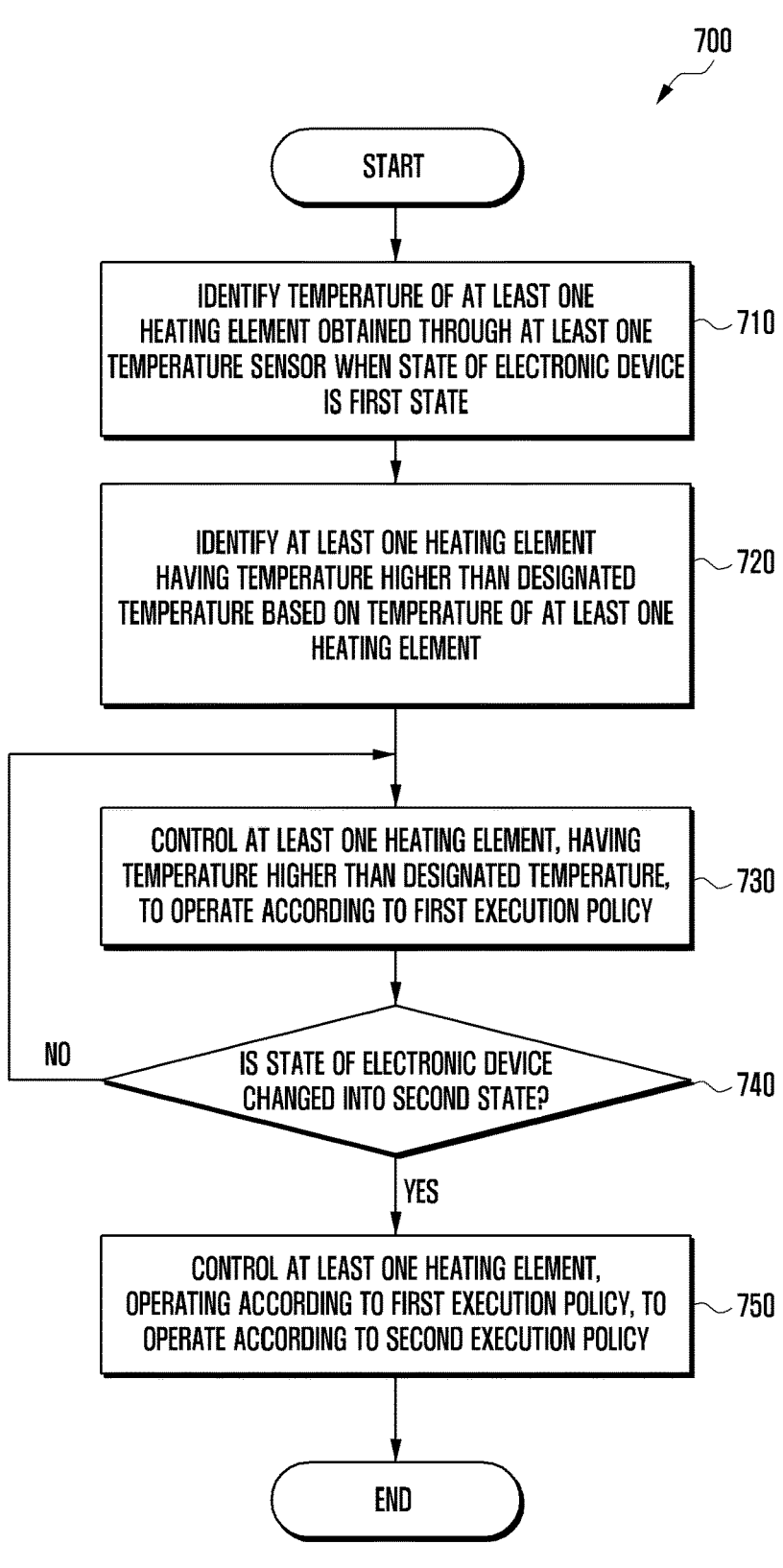

700

START

IDENTIFY TEMPERATURE OF AT LEAST ONE
HEATING ELEMENT OBTAINED THROUGH AT LEAST ONE
TEMPERATURE SENSOR WHEN STATE OF ELECTRONIC DEVICE
IS FIRST STATE — 710

IDENTIFY AT LEAST ONE HEATING ELEMENT
HAVING TEMPERATURE HIGHER THAN DESIGNATED
TEMPERATURE BASED ON TEMPERATURE OF AT LEAST ONE
HEATING ELEMENT — 720

CONTROL AT LEAST ONE HEATING ELEMENT, HAVING
TEMPERATURE HIGHER THAN DESIGNATED TEMPERATURE,
TO OPERATE ACCORDING TO FIRST EXECUTION POLICY — 730

IS STATE OF ELECTRONIC DEVICE
CHANGED INTO SECOND STATE? — 740

NO

YES

CONTROL AT LEAST ONE HEATING ELEMENT,
OPERATING ACCORDING TO FIRST EXECUTION POLICY, TO
OPERATE ACCORDING TO SECOND EXECUTION POLICY — 750

END

ELECTRONIC DEVICE INCLUDING FLEXIBLE DISPLAY AND METHOD FOR CONTROLLING TEMPERATURE ACCORDING TO STATE OF ELECTRONIC DEVICE USING THE SAME

CROSS-REFERENCE TO RELATED APPLICATION(S)

This application is a continuation application, claiming priority under § 365(c), of an International application No. PCT/KR2021/013994, filed on Oct. 12, 2021, which is based on and claims the benefit of a Korean patent application number 10-2020-0131166, filed on Oct. 12, 2020, in the Korean Intellectual Property Office, and of a Korean patent application number 10-2020-0177420, filed on Dec. 17, 2020, in the Korean Intellectual Property Office, the disclosure of each of which is incorporated by reference in its entirety.

TECHNICAL FIELD

The disclosure relates to an electronic device including a flexible display and a method for controlling a temperature according to a state of the electronic device using the same.

BACKGROUND ART

With the development of the digital technology, an electronic device is provided in various forms, such as a smart phone, a tablet personal computer (PC), and a personal digital assistant (PDA). The electronic device tends to be designed to provide a larger screen while having a portable size which does not cause inconvenience to a hand of a user. For example, the electronic device may be implemented to extend a screen in a slide way. Such a slide way may include a slide-in manner of a part of a flexible display entering the internal space of the electronic device or a slide-out manner of a part of the flexible display being drawn from the internal space of the electronic device.

The above information is presented as background information only to assist with an understanding of the disclosure. No determination has been made, and no assertion is made, as to whether any of the above might be applicable as prior art with regard to the disclosure.

DISCLOSURE

Technical Problem

An electronic device may perform an execution policy for controlling a temperature of at least one heating element when the temperature of the at least one heating element is higher than a designated temperature. However, an electronic device operating in a slide way may have degraded system performance because the electronic device simply performs one execution policy for controlling a temperature of at least one heating element although a heat discharge structure according to a slide-in or a slide-out is different.

Aspects of the disclosure are to address at least the above-mentioned problems and/or disadvantages and to provide at least the advantages described below. Accordingly, an aspect of the disclosure is to provide an electronic device controlled to operate according to a different execution policy based on a state of the electronic device, for example, a state in which a part of a flexible display has entered the internal space of the electronic device or a state in which a part of the flexible display has been drawn from the internal space of the electronic device and/or a temperature of at least one heating element.

Technical Solution

Additional aspects will be set forth in part in the description which follows and, in part, will be apparent from the description, or may be learned by practice of the presented embodiments.

In accordance with an aspect of the disclosure, an electronic device is provided. The electronic device includes a housing, a flexible display including a sliding plate slidable out from the housing and a bendable section overlappingly coupled to the sliding plate and capable of being drawn from an internal space of the housing, a multi-bar structure supporting the bendable section of the flexible display, a sensor circuit configured to detect a first state in which at least a part of the bendable section enters the internal space of the housing due to a slide-in of the sliding plate or a second state in which at least a part of the bendable section is drawn into an external space of the housing due to a slide-out of the sliding plate, at least one temperature sensor disposed adjacent to at least one heating element, and a processor operatively coupled to the sensor circuit and the at least one temperature sensor. The processor may be configured to obtain a temperature of the at least one heating element through the at least one temperature sensor in the first state, identify at least one heating element having a temperature higher than a designated temperature based on the obtained temperature of the at least one heating element, and control the at least one heating element having the temperature higher than the designated temperature to operate according to a first execution policy.

In accordance with another aspect of the disclosure, a method of controlling a temperature according to a state of an electronic device including a flexible display, is provided. The method includes when a state of the electronic device is a first state, obtaining a temperature of at least one heating element through at least one temperature sensor disposed adjacent to the at least one heating element, identifying at least one heating element having a temperature higher than a designated temperature based on the obtained temperature of the at least one heating element, and controlling the at least one heating element having the temperature higher than the designated temperature to operate according to a first execution policy. The first state may include a state in which at least a part of a bendable section of the flexible display enters an internal space of the housing due to a slide-in of a sliding plate slidable out from the housing.

In accordance with another aspect of the disclosure, an electronic device is provided. The electronic device includes a housing, a flexible display including a sliding plate slidable out from the housing and a bendable section overlappingly coupled to the sliding plate and capable of being drawn from an internal space of the housing, a multi-bar structure supporting the bendable section of the flexible display, a sensor circuit configured to detect a first state in which at least a part of the bendable section enters the internal space of the housing due to a slide-in of the sliding plate or a second state in which at least a part of the bendable section is drawn into an external space of the housing due to a slide-out of the sliding plate, at least one temperature sensor disposed adjacent to at least one heating element, a memory storing a first execution policy, a second execution policy, and a third execution policy operating based on the first state, the second state and/or a temperature of the at least one heating element, and a processor operatively coupled to the sensor circuit, the at least one temperature sensor, and the memory. The processor may be configured to control at least one heating element having a temperature higher than a first designated temperature to operate according to the first execution policy based on a temperature of the at least one heating element obtained through the at least one temperature sensor in the first state, control the at least one heating element, operating according to the first execution policy and having the temperature higher than the first designated temperature, to operate according to the second execution policy having higher performance than the first execution policy based on a change in a state of the electronic device from the first state to the second state, identify at least one heating element having a temperature higher than a second designated temperature based on a temperature of the at least one heating element obtained through the at least one temperature sensor in the second state, and control the at least one heating element, operating according to the second execution policy and having the temperature higher than the second designated temperature, to operate according to the third execution policy.

Advantageous Effects

The electronic device according to various embodiments of the disclosure may control at least one heating element to operate according to a different execution policy based on a state of the electronic device and/or a temperature of the at least one heating element. Accordingly, heat dissipation performance of the at least one heating element can be improved, and maximum performance of the electronic device can be secured.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which:

FIG. 5B is a diagram for describing a degree of generation of heat of at least one heating element measured in a second state in an electronic device according to an embodiment of the disclosure;

FIG. 7 is a flowchart for describing a method of controlling a temperature based on a state of an electronic device according to an embodiment of the disclosure;

Throughout the drawings, like reference numerals will be understood to refer to like parts, components, and structures.

MODE FOR DISCLOSURE

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
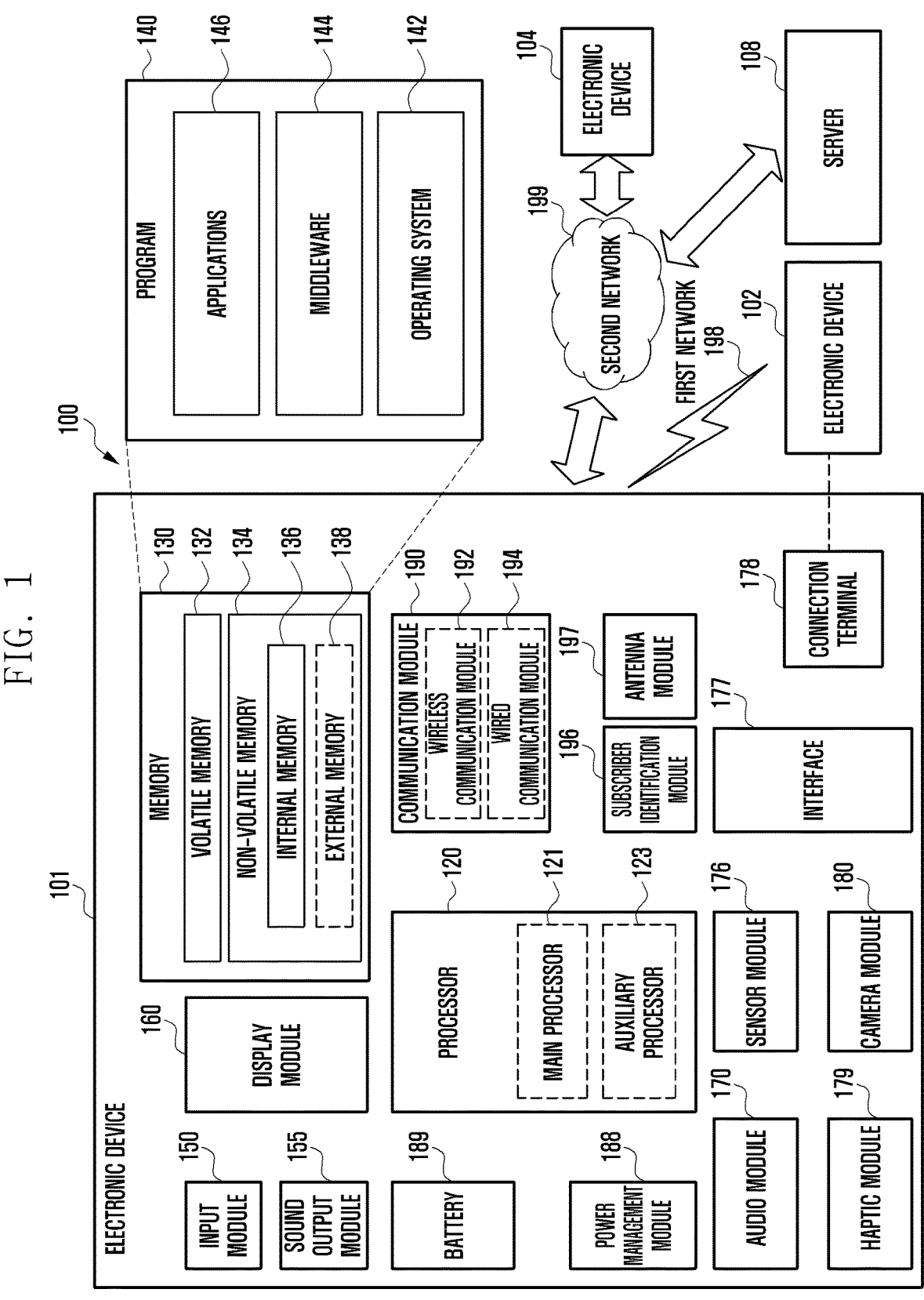
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment, the electronic device 101 may communicate with the external electronic device 104 via the server 108. According to an embodiment, the electronic device 101 may include a processor 120, a memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor

123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and/or an external memory 138.

The program 140 may be stored in the memory 130 as software, and may include, for example, an operating system (OS) 142, middleware 144, or applications 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., the external electronic device 102) (e.g., speaker or headphone) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., through wires) or wirelessly. According to an embodiment, the interface 177 may include, for example, a high-definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the external electronic device 102). According to an embodiment, the connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., an application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large-scale antenna. The wireless communication module 192 may support various requirements specified in the electronic device 101, an external electronic device (e.g., the external electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., an mmwave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102 and 104 or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
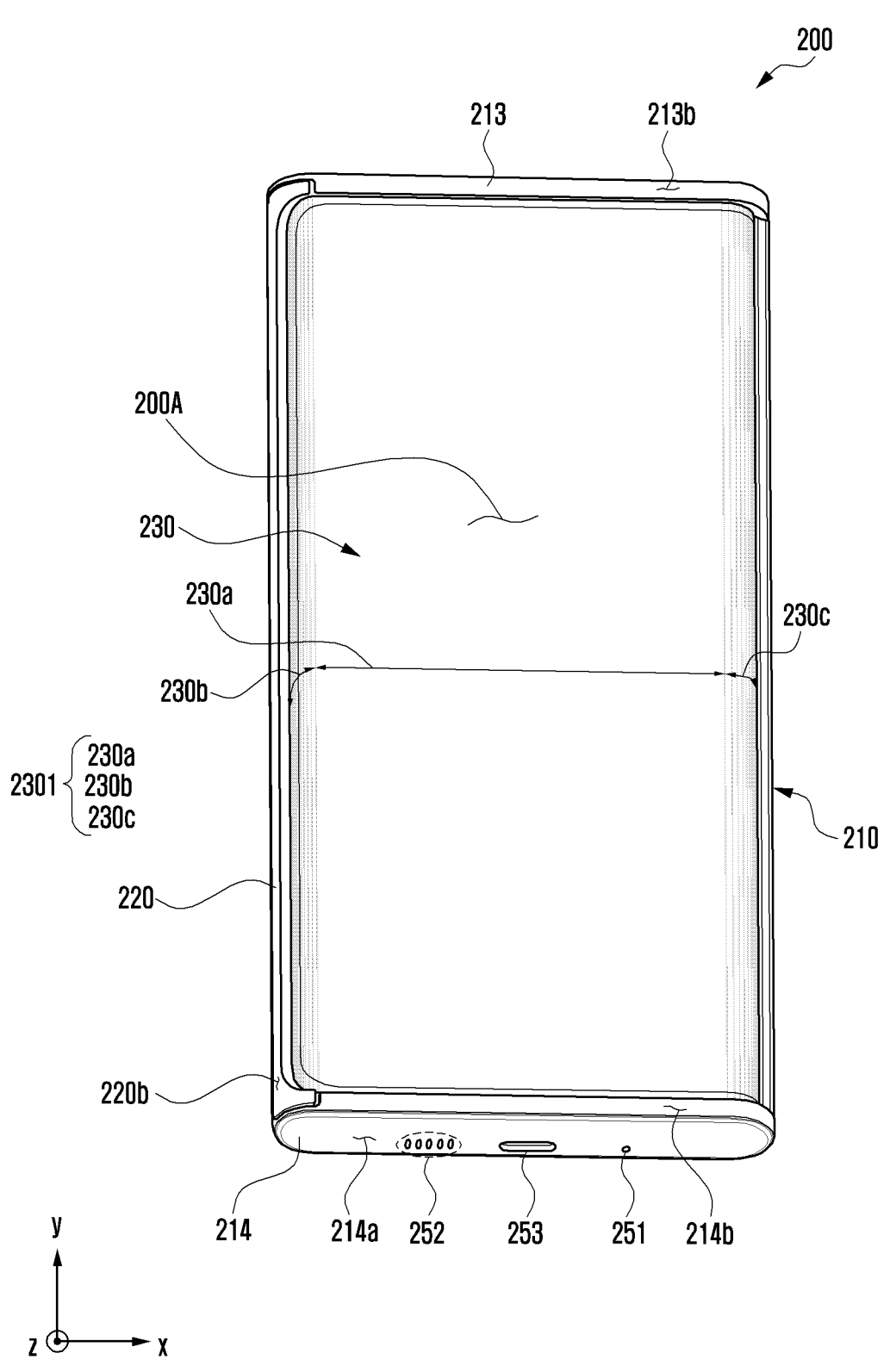
FIG. 2 is a front perspective view illustrating an electronic device having a first state (e.g., a closed state) according to an embodiment of the disclosure.

FIG. 2 is a front perspective view showing an electronic device in a first state (e.g., a closed state) according to an embodiment of the disclosure.

Figure 3:
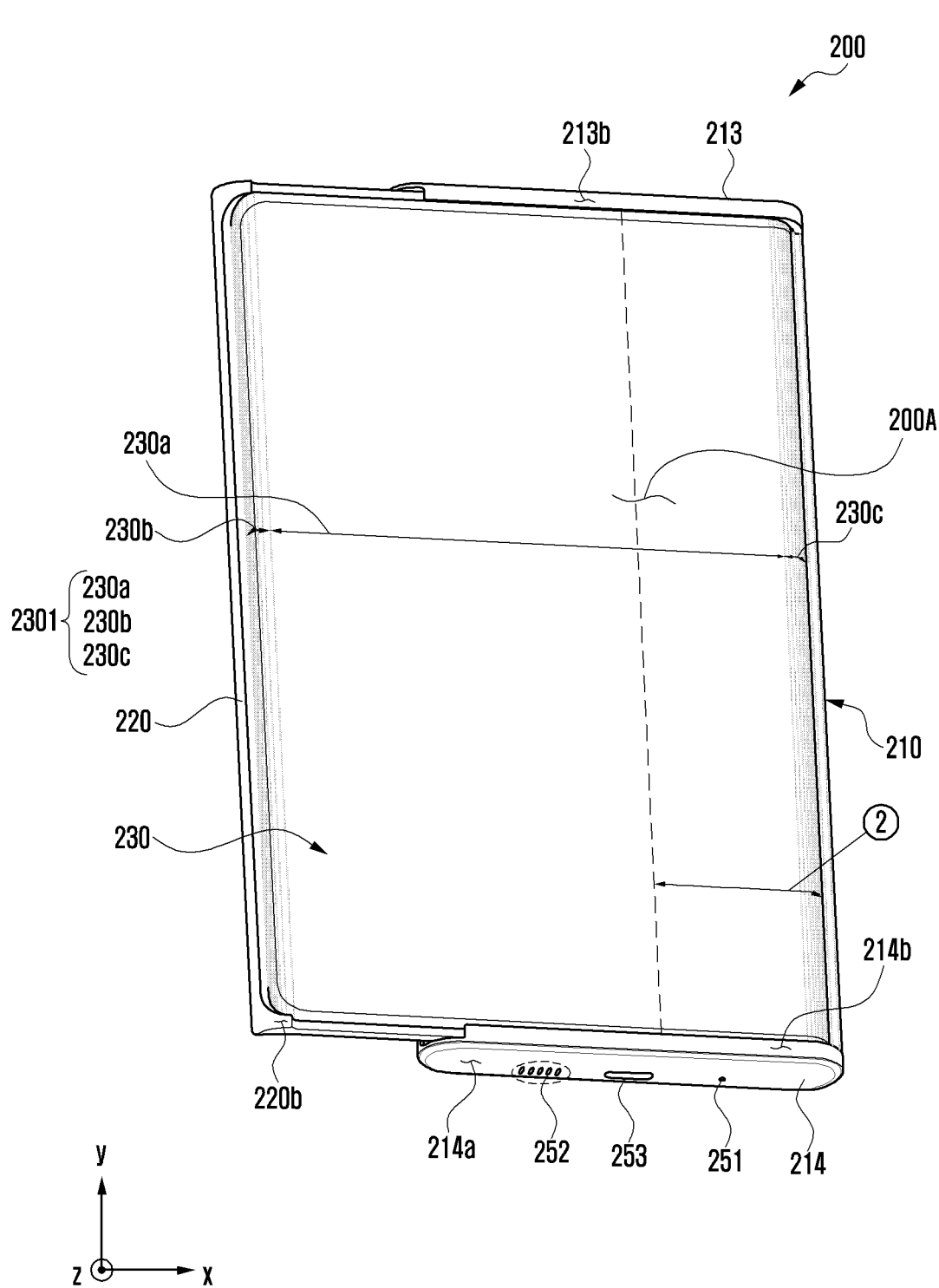
FIG. 3 is a front perspective view illustrating an electronic device having a second state (e.g., an open state) according to an embodiment of the disclosure.

FIG. 3 is a front perspective view showing an electronic device in a second state (e.g., an open state) according to an embodiment of the disclosure.

According to various embodiments, electronic device 200 illustrated in FIGS. 2 and 3 may include the electronic device 101 illustrated in FIG. 1.

Referring to FIGS. 2 and 3, an electronic device 200 may be implemented such that a screen 2301 is expanded in a sliding type. For example, the screen 2301 may have an area, which is illustrated to the outside, of a flexible display 230.

In an embodiment, FIG. 2 shows the electronic device 200 without the screen 2301 expanded and FIG. 3 shows the electronic device 200 with the screen 2301 expanded. When the screen 2301 is not expanded, a sliding plate 220 for sliding motion of the flexible display 230 is not slid out, which may be referred to as a "first state" or a "closed state" hereafter. When the screen 2301 is expanded, the screen 2301 is maximally expanded not to further expand by slide-out of the sliding plate 220, which may be referred to as a "second state" or an "open state" hereafter.

In an embodiment, slide-out may be at least partial movement of the sliding plate 220 in a first direction (e.g., −x axis direction) when the electronic device 200 is changed into the open state from the closed state. The open state may be defined as the state in which the screen 2301 has been expanded, in comparison to the closed state, and may provide the screen 2301 in various sizes, depending on the movement position of the sliding plate 220.

In various embodiments, the state of the electronic device 200 may include a "third state" or an "intermediate state". The intermediate state may refer to the state between the closed state illustrated in FIG. 2 and the open state illustrated in FIG. 3. The screen 2301 may include an active area, which is visually exposed such that images can be output, of the flexible display 230, and the electronic device 200 can adjust the active area in accordance with movement of the sliding plate 220 or movement of the flexible display 230. In the following description, the open state may refer to the state in which the screen 2301 has been maximally expanded. In various embodiments, the flexible display 230 slidably disposed in the electronic device 200 illustrated in FIG. 2 and providing the screen 2301 may be referred to as a "slide-out display" or an "expandable display".

In an embodiment, the electronic device 200 may include a sliding structure related to the flexible display 230. For example, when the flexible display 230 is moved a configured distance by an external force, the flexible display 230 can be changed into the open state from the closed state or into the closed state from the open state (e.g., semiautomatic sliding) by an elastic structure included in the sliding structure even if there is no more external force.

In another embodiment, when a signal is produced through an input device included in the electronic device, the electronic device 200 can be changed into the open state from the closed state or into the closed state from the open state by a driving device such as a motor connected with the flexible display 230. For example, when a signal is produced through a hardware button or a software button provided through a screen, the electronic device 200 can be changed into the open state from the closed state or into the closed state from the open state.

In another embodiment, when a signal is produced from various sensors such as a pressure sensor, the electronic device 200 can be changed into the open state from the closed state or into the closed state from the open state. For example, the electronic device 200 can detect, through a sensor, a squeeze gesture that presses a predetermined section of the electronic device 200 through a portion of a hand (e.g., a palm or a finger) when a user carries or holds the electronic device 200 with hand, and the electronic device 200 can be changed into the open state from the closed state or into the closed state from the open state in correspondence to the squeeze gesture.

In an embodiment, the flexible display 230 may have a bendable section ② (see FIG. 3). The bendable section ② may include an expanded portion of the screen 2301 when the electronic device 200 is changed into the open state from the closed state. When the electronic device 200 is changed into the open state from the closed state, the bendable section ② is drawn out of the internal space of the electronic device 200 like sliding, whereby the screen 2301 can be expanded. When the electronic device 200 is changed into the closed state from the open state, at least a portion of the bendable section ② is inserted into the internal space of the electronic device 200 like sliding, whereby the screen

2301 can be contracted. When the electronic device 200 is changed into the closed state from the open state, at least a portion of the bendable section ② may be moved into the internal space of the electronic device 200 while bending. For example, the flexible display 230 may include a flexible substrate (e.g., a plastic substrate) made of a polymer material including Polyimide (PI) or Polyester (PET).

In an embodiment, the electronic device 200 may include a housing 210, a sliding plate 220, and/or the flexible display 230.

In an embodiment, the housing (or case) 210 may include a back cover (not illustrated), a first side cover 213, or a second side cover 214. The back cover (not illustrated), the first side cover 213, or the second side cover 214 may be connected to a support member (not illustrated) disposed in the electronic device 200 and may form at least a portion of the external appearance of the electronic device 200.

In an embodiment, the back cover (not illustrated) may form at least a portion of the rear surface (not illustrated) of the electronic device 200. In an embodiment, the back cover (not illustrated) may be substantially transparent. For example, the rear cover may be made of coated or colored glass, ceramic, a polymer, metal (e.g., aluminum, stainless steel (STS), or magnesium), or a combination of at least two of these materials. In an embodiment, when the bendable section ② of the flexible display 230 is inserted in the internal space of the housing 210 (e.g., the closed state), at least a portion of the bendable section ② may be positioned to be seen from the external through the back cover (not illustrated). In this case, the back cover (not illustrated) may be made of a transparent material and/or a semi-transparent material.

In an embodiment, the first side cover 213 and the second side cover 214 may be disposed at opposite sides. For example, the first side cover 213 and the second side cover 214 may be disposed at opposite sides with the flexible display 230 therebetween in a second direction (e.g., y axis direction) perpendicular to a first direction (e.g., −x axis direction) of slide-out of the sliding plate 320. The first side cover 213 may form at least a portion of a first side surface (not illustrated) of the electronic device 200 and the second side cover 214 may form at least a portion of a second side surface 214a of the electronic device 200, in which the second side surface 214a faces an opposite direction to the first side surface (not illustrated). The first side cover 213 may have a first edge 213b extending from the edge of the first side surface (not illustrated). For example, the first edge 213b may form at least a portion of a bezel of the electronic device 200. The second side cover 214 may have a second edge 214b extending from the edge of the second side surface 214a. For example, the second edge 214b may form at least a portion of another bezel of the electronic device 200. In an embodiment, in the closed state illustrated in FIG. 2, the surface of the first edge 213b, the surface of the second edge 214b, and the surface of the sliding plate 220 are smoothly connected, thereby forming a curved portion (not illustrated) corresponding to a first curved surface portion 230b of the screen 2301. In an embodiment, the surface of the first edge 213b or the surface of the second edge 214b may have another curved surface portion (not illustrated) corresponding to a second curved surface portion 230c, which is disposed opposite to the first curved surface portion 230b, of the screen 2301.

In an embodiment, the sliding plate 220 can slide on the support member (not illustrated) disposed in the electronic device 200. A least a portion of the flexible display 230 may be disposed on the sliding plate 220, and the closed state illustrated in FIG. 2 or the open state illustrated in FIG. 3 may be implemented based on the position of the sliding plate 220 on the support member (not illustrated). In an embodiment, the flexible display 230 may be attached to the sliding plate 220 through an adhesive member (not illustrated). In an embodiment, the adhesive member may include a thermal reactive adhesive member, an optical reactive adhesive member, a common adhesive, and/or a double-sided tape. In another embodiment, the flexible display 230 may be slid in a recess formed on the sliding plate 220, thereby being able to disposed and fixed on the sliding plate 220. The sliding plate 220 may serve to support at least a portion of the flexible display 230 and may be referred to as a display support structure.

In an embodiment, the sliding plate 220 may have a third edge 220b forming an outer surface of the electronic device 200 (e.g., a surface exposed to the outside and forming the external appearance of the electronic device 200). For example, the third edge 220b may form the bezel around the screen 2301 together with the first edge 213b and the second edge 214b in the closed state illustrated in FIG. 2. The third edge 220b may extend in a second direction (e.g., y axis direction) to connect an end of the first side cover 213 and an end of the second side cover 214 in the closed state. For example, in the closed state illustrated in FIG. 2, the surface of the third edge 220b may be smoothly connected with the surface of the first edge 213b and/or the surface of the second edge 214b.

In an embodiment, at least a portion of the bendable section ② is drawn out of the electronic device 200 by slide-out of the sliding plate 220, whereby the state (e.g., the open state) in which the screen 2301 has been expanded, as illustrated in FIG. 3, can be provided.

In an embodiment, the screen 2301 may have a flat surface portion 230a, and a first curved surface portion 230b and/or the second curved surface portion 230c disposed at opposite sides with the flat surface portion 230a therebetween in the closes state illustrated in FIG. 2. For example, the first curved surface portion 230b and the second curved surface portion 230c may be substantially symmetrical with the flat surface portion 230a therebetween. In an embodiment, when the closed state illustrated in FIG. 2 is changed into the open state illustrated in FIG. 3, the flat surface portion 230a can be expanded. For example, a partial area of the bendable section ② that forms the second curved surface portion 230c in the closed state illustrated in FIG. 2 may be included in the expanded flat surface portion 230a and may be formed as another area of the bendable section ② when the closed state illustrated in FIG. 2 is changed into the open state illustrated in FIG. 3.

In an embodiment, the electronic device 200 may include an opening (not illustrated) for drawing in or out the bendable section ② and/or a pulley (not illustrated) disposed in the opening (not illustrated). The pulley (not illustrated) may be positioned to correspond to the bendable section ②. The pulley (not illustrated) rotates when the closed state illustrated in FIG. 2 and the open state illustrated in FIG. 3 are switched, whereby movement and movement direction of the bendable section ② can be guided. The first curved surface portion 230b may be formed to correspond to a curved surface formed on a surface of the sliding plate 220. The second curved surface portion 230c may be formed by a portion corresponding to the curved surface of the pulley (not illustrated) in the bendable section ②. The first curved surface portion 230b is positioned opposite to the second curved surface portion 230c in the closed state or the open state of the electronic device 200, thereby being able to improve the aesthetic appearance of the screen 2301. In another embodiment, the electronic device 200 may be implemented with the flat surface portion 230*a* expanded without the first curved surface portion 230*b*.

In an embodiment, the flexible display 230 may further include a touch sensing circuit (e.g., a touch sensor). Though not illustrated, in various embodiments, the flexible display 230 may be coupled to or disposed close to a pressure sensor that can measure the intensity (pressure) of a touch and/or a digitizer that detects a magnetic field type of pen input device (e.g., a stylus pen). For example, the digitizer may include a coil member disposed on a dielectric substrate to be able to detect an electromagnetic induction type resonance frequency applied from a pen input device.

For example, the electronic device 200 may have a microphone hole 251 (e.g., the input module 150 illustrated in FIG. 1), a speaker hole 252 (e.g., the sound output module 155 illustrated in FIG. 1), and/or a connector hole 253 (e.g., the connection terminal 178 illustrated in FIG. 1). In an embodiment, the electronic device 200 may not include at least one of the components or may additionally include other components.

In an embodiment, the microphone hole 251 may be formed at least a portion of the second side surface 214*a* to correspond to a microphone disposed in the electronic device 200. The position of the microphone hole 251 may be varied without being limited to the embodiment illustrated in FIG. 2. In an embodiment, the electronic device 200 may include a plurality of microphones that can detect the directions of sounds.

In an embodiment, the speaker hole 252 may be formed at least a portion of the second side surface 214*a* to correspond to a speaker disposed in the electronic device 200. The position of the speaker hole 252 may be varied without being limited to the embodiment illustrated in FIG. 2. In an embodiment, the electronic device 200 may have a receiver hole for phone call. In an embodiment, the microphone hole 251 and the speaker hole 252 may be implemented in one hole, or the speaker hole 252 may not be provided like a piezo speaker.

In an embodiment, the connector hole 253 may be formed at least a portion of the second side surface 214*a* to correspond to a connector (e.g., a universal serial bus (USB) connector) disposed in the electronic device 200. The electronic device 200 can transmit and/or receive power and/or data to and/or an external electronic device electrically connected with the connector through the connector hole 253. The position of the connector hole 253 may be varied without being limited to the embodiment illustrated in FIG. 2.

Though not illustrated, in various embodiments, the electronic device 200 may include a camera module (e.g., a front camera) that produces an image signal based on light received through a surface (e.g., a front surface 200A) of the electronic device 200 disposed in the direction that the screen 2301 faces. For example, the camera module (e.g., a front camera) (not illustrated) may be disposed in the housing 210 and aligned with an opening (e.g., a through-hole or a notch) formed in the flexible display 230. The camera module (e.g., a front camera) (not illustrated) can produce an image signal by receiving light through the opening and a partial area of a transparent cover overlapping the opening. The transparent cover serves to protect the flexible display 230 from, the outside, and may include a substance such as polyimide or Ultra-Thin Glass (UTG).

In various embodiments, the camera module (e.g., a front camera) (not illustrated) may be disposed at the lower end of at least a portion of the screen 2301 of the flexible display 230 and can perform related functions (e.g., taking images) without the position thereof visually illustrated (or exposed). In this case, when the screen 2301 is seen from above, the camera module (e.g., a front camera) (not illustrated) is disposed to overlap at least a portion of the screen 2301, thereby being able to obtain images of an external subject without being exposed to the outside.

Though not illustrated, in various embodiments, the electronic device 200 may further include a key input device (e.g., the input module 150 illustrated in FIG. 1). The key input device may be disposed on a first side surface (not illustrated) of the electronic device 200 that is formed by the first side cover 213. In various embodiments, the key input device may include at least one sensor module.

Though not illustrated, in various embodiments, the electronic device 200 may include various sensor modules (e.g., the sensor module 176 illustrated in FIG. 1). The sensor module can produce an electrical signal or a data value corresponding to the internal operation state of the electronic device 200 or an external environmental state. For example, the sensor module may include a proximity sensor that produces a signal related to approach of an external object based on light received through the front surface 200A, which is disposed in the direction that the screen 2301 faces, of the electronic device 200. As another example, the sensor module may include various biosensors such as a fingerprint sensor or a heart rate monitor (HRM) sensor that detects biological information based on light received through the front surface 200A or a rear surface (not illustrated) of the electronic device 200. The electronic device 200 may include at least one of various other sensor modules, for example, a gesture sensor, a gyro sensor, a barometer sensor, a magnetic sensor, an acceleration sensor, a grip sensor, a color sensor, an infrared (IR) sensor, a biosensor, a temperature sensor, a humidity sensor, or an illumination sensor.

Figure 4A:
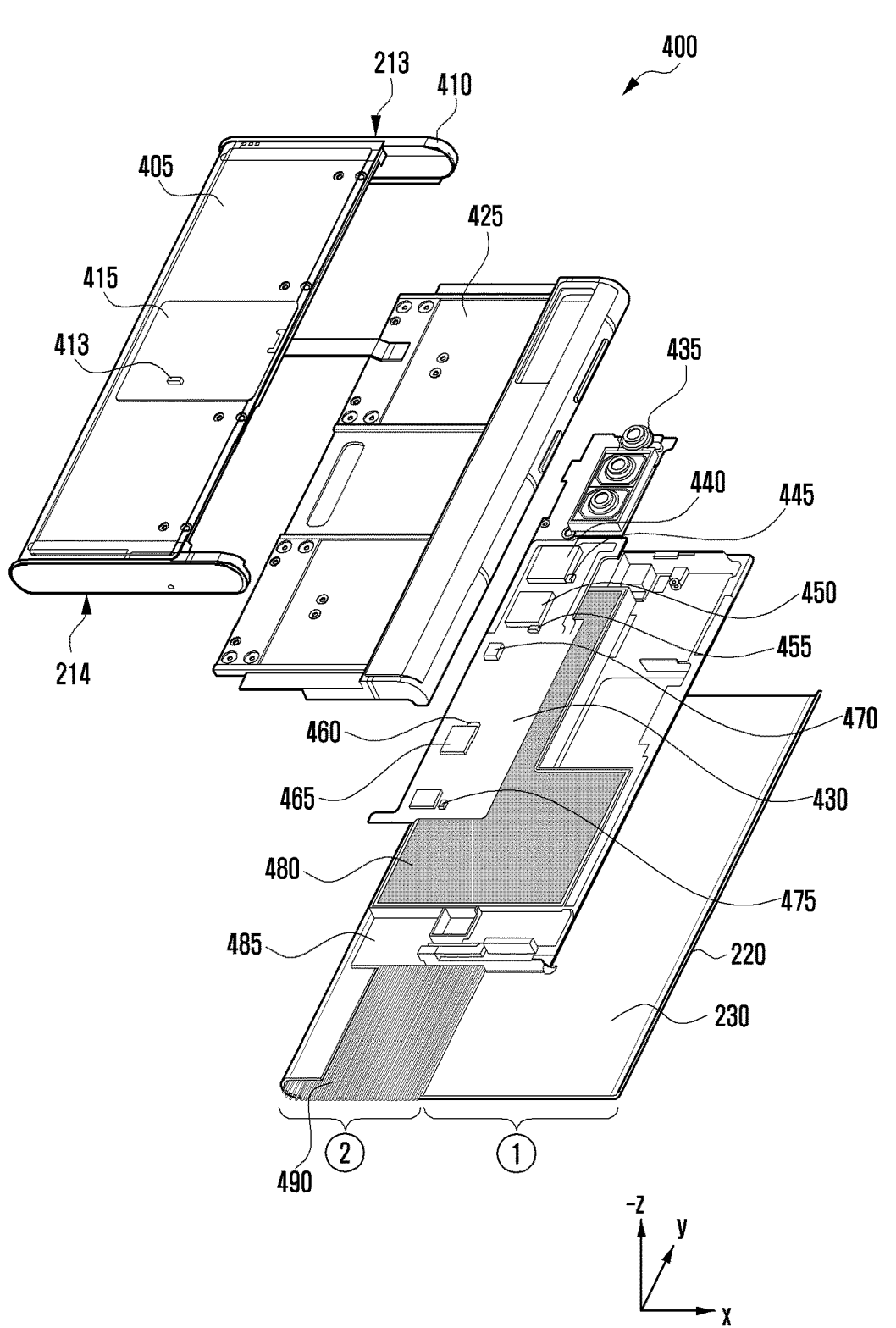
FIG. 4A is an exploded perspective view illustrating the electronic device of FIG. 2 according to an embodiment of the disclosure.
Figure 4B:
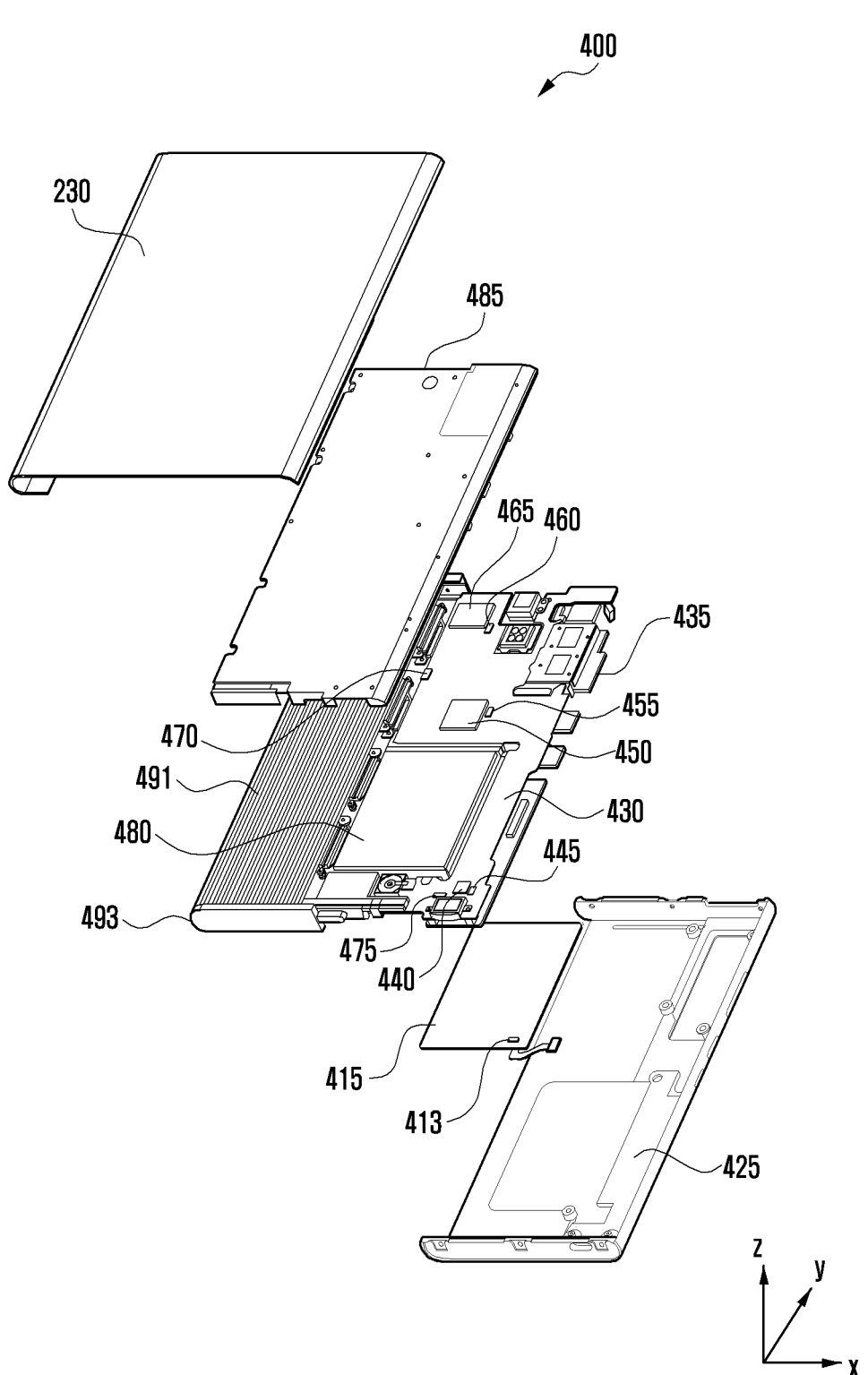
FIG. 4B is an exploded perspective view illustrating the electronic device of FIG. 2 according to an embodiment of the disclosure.
Figure 4C:
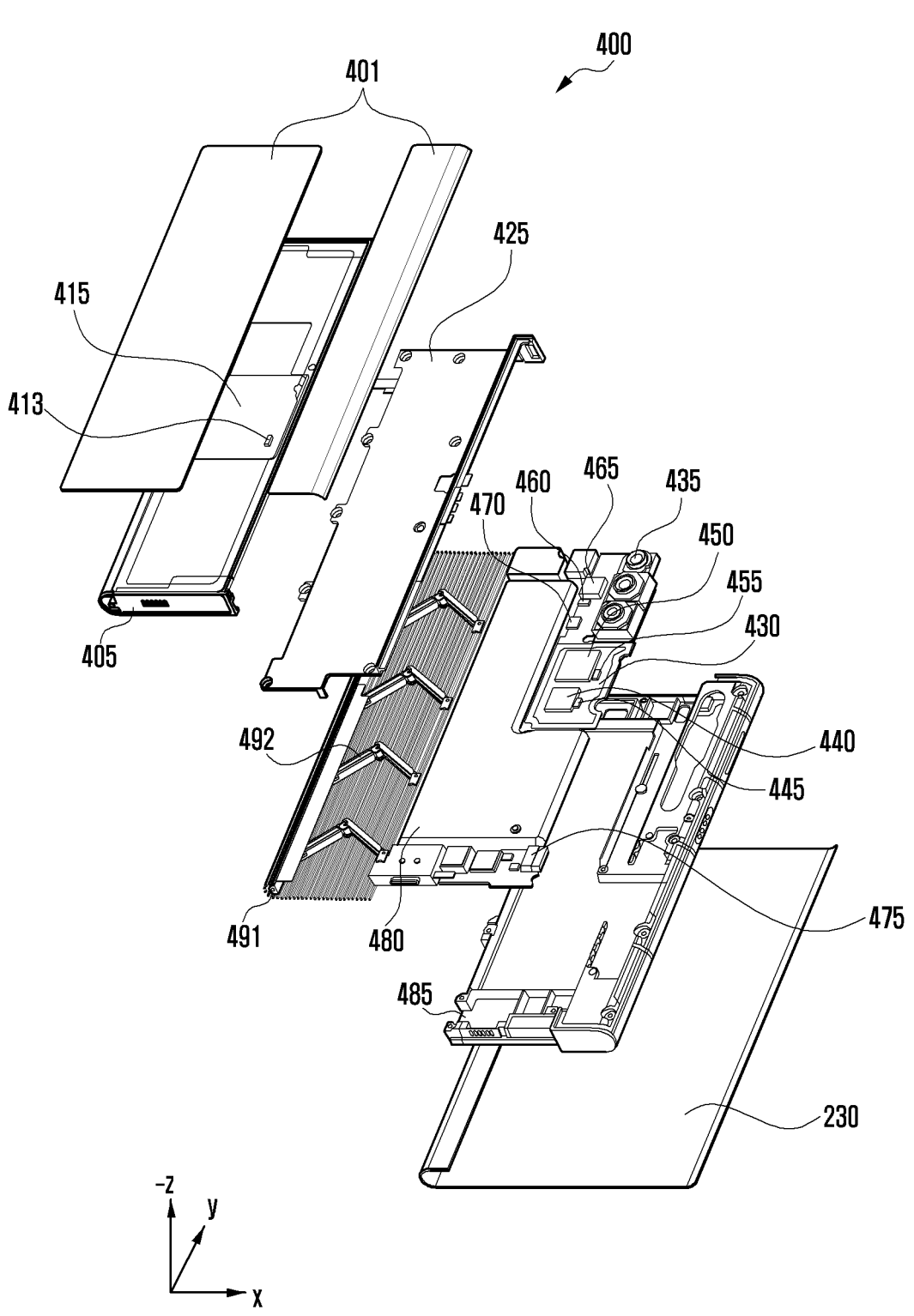
FIG. 4C is an exploded perspective view illustrating the electronic device of FIG. 2 according to an embodiment of the disclosure.

FIGS. 4A, 4B, and 4C are exploded perspective views showing the electronic device illustrated in FIG. 2 according to various embodiments of the disclosure.

Referring to FIG. 4A, illustrating diagram 400, an electronic device 200 may include a back cover (not illustrated), a first side cover 213, a second side cover 214, a first support member 485, a second support member 425, a third support member 05, a sliding plate 220, a flexible display 230, a PCB 430 (e.g., a flexible printed circuit board (FPCB) or a rigid-flexible PCB (RFPCB), and/or a multi-bar structure (or a multi-bar assembly) 490. Reference numerals described with reference to FIGS. 2 and 3 of the reference numerals illustrated FIG. 4A are not described.

In an embodiment, the first support member 485, the second support member 425, and/or a third support member 405 are frame structures that can resist load, and can contribute to durability or strength of the electronic device 200. The first support member 485, the second support member 425, and/or the third support member 405 may include a nonmetallic substance (e.g., polymer) or a metallic substance. A housing (e.g., the housing 210 illustrated in FIG. 2) including the back cover (not illustrated), the first side cover 213, or the second side cover 214, the sliding plate 220, the flexible display 230, the PCB 430, and the multi-bar structure 490 may be disposed at or coupled to the first support member 485, the second support member 425, and/or the third support member 405.

In an embodiment, the second support member 425 may have a plate shape. The second support member 425, for example, when seen in the −z axis direction, may have a plate shape overlapping at least a portion of the first support member 485, or may be coupled to the first support member 485 and/or the third support member 405. The second support member 425 may be disposed between the first support member 485 and the third support member 405. The third support member 405 may be coupled to the first support member 485 and/or the second support member 425 with the second support member 425 therebetween. The PCB 430 may be disposed on the second support member 425 between the first support member 485 and the second support member 25. At least some of the first support member 485, the second support member 425, and the third support member 405 may include at least one of a metallic substance or a nonmetallic substance (e.g., polymer).

In an embodiment, the sliding plate 220 may be disposed to be slidable on the first support member 485. For example, a sliding structure that supports and guides coupling of the first support member 485 and the sliding plate 220 or movement of the sliding plate 220 may be disposed between the first support member 485 and the sliding plate 220.

In an embodiment, the flexible display 230 may have a first section ① extending from the bendable section ②. The first section ① may be disposed on the sliding plate 220. When the closed state illustrated in FIG. 2 is changed into the open state illustrated in FIG. 3, the bendable section ② connected with the first section ① is moved out like sliding by movement of the sliding plate 220, whereby the screen (e.g., see the screen 2301 illustrated in FIG. 3) can be expanded. When the open state illustrated in FIG. 3 is changed into the closed state illustrated in FIG. 2, the bendable section ② is at least partially moved into the electronic device 200 by movement of the sliding plate 220, whereby the screen (e.g., screen 2301 illustrated in FIG. 2) can be contracted. In an embodiment, a pulley (not illustrated) may be positioned to correspond to the bendable section ②. The pulley (not illustrated) can be rotated by movement of the bendable section ② when the closed state illustrated in FIG. 2 and the open state illustrated in FIG. 3 are switched.

In an embodiment, in the closed state illustrated in FIG. 2 or the open state illustrated in FIG. 3, at least a portion of the multi-bar structure 490 may be positioned to overlap the screen 2301 (e.g., seen FIG. 2 or FIG. 3) and may support the bendable section ② such that the bendable section ② of the flexible display 230 keep smoothly connected with the first section ① of the flexible display 230. The multi-bar structure 490 can help the bendable section ② move while keeping smoothly connected with the first section ① when the closed state illustrated in FIG. 2 and the open state illustrated in FIG. 3 are switched.

In an embodiment, a camera module 435 (e.g., the camera module 180 illustrated in FIG. 1), a charging circuit 440 (e.g., the power management module 188 illustrated in FIG. 1), an application processor (AP) 450 (e.g., the processor 120 illustrated in FIG. 1), a wireless communication circuit 465, a sliding sensor 470, an interface (e.g., the interface 177 illustrated in FIG. 1), and/or a memory (e.g., the memory 130 illustrated in FIG. 1) may be mounted on the PCB 430.

In an embodiment, the camera module 435 (e.g., a rear camera) may be disposed to face the −z axis direction corresponding to the rear surface of the electronic device 200, and a portion (e.g., a lens) of the camera module 435 may be visually exposed through a camera hole formed at the second support member 425. The camera module 435 may include one or more lenses, an image sensor, and an image signal processor. The camera module 435 may include a plurality of camera modules. The electronic device 200 may include a plurality of camera modules (e.g., a dual camera or a triple camera) having different properties (e.g., angles of view) or functions. For example, a plurality of camera modules including lenses having different angles of view may be provided and the electronic device 200 can change the angles of view of the plurality of camera modules operated in the electronic device 200 based on selection of a user. A plurality of camera modules may include at least one of a wide angle camera, a telephoto camera, a color camera, a monochrome camera, or an infrared (IR) camera (e.g., a time of flight (TOF) camera, structured light camera). In an embodiment, the IR camera may operate as at least a portion of a sensor module (not illustrated).

In an embodiment, the charging circuit 440 may be electrically connected with a wireless power reception circuit 415 and/or an interface (e.g., a USB connector (not illustrated)). The charging circuit 440 can receive power transmitted from a charging device (not illustrated) through the wireless power reception circuit 415 or a USB connector and can supply power to a battery 480. In an embodiment, the charging circuit 440 may be electrically connected with other components of the electronic device 200 and may supply power to other components of the electronic device 200. In an embodiment, the charging circuit 440 may be referred to as a PMIC or a charger.

In an embodiment, at least one temperature sensor may be mounted on the PCB 430. For example, the at least one temperature sensor may be disposed in areas respectively close to the charging circuit 440, the AP 450, the wireless communication circuit 465, and the interface. In an embodiment, the at least one temperature sensor may be disposed on the third support member 405.

At least one temperature sensor according to various embodiments may include first to fifth temperature sensors. However, the disclosure is not limited thereto.

For example, a first temperature sensor 413 may be disposed in an area close to the wireless power reception circuit 415. The first temperature sensor 413 can detect a temperature change of the wireless power reception circuit 415. As another example, a second temperature sensor 445 may be disposed in an area close to the charging circuit 440. The second temperature sensor 445 can detect a temperature change of the charging circuit 440. As another example, a third temperature sensor 455 may be disposed in an area close to the AP 450 and can detect a temperature change of the AP 450. As another example, a fourth temperature sensor 460 may be disposed in an area close to the wireless communication circuit 465 and can detect a temperature change of the wireless communication circuit 465. As another example, a fifth temperature sensor 475 may be disposed in an area close to the interface (e.g., a USB connector) and can detect a temperature change of the interface.

In an embodiment, the sliding sensor 470 may include a sensor that detects the degree of slide-out of the flexible display 230 from the housing 210 (e.g., detect the first state, the second state, and the third state). For example, the sliding sensor 470 may include a magnetic force sensor that senses a magnetic force that varies in accordance with the distance from a magnetic substance (e.g., a magnet) disposed on the PCB 430.

In an embodiment, the interface may include at least one of a High Definition Multimedia Interface (HDMI), a universal serial bus (USB) interface, an SD card interface, or an audio interface. The interface can electrically or physically connect the electronic device 200 to external electronic devices and may include an USB connector, an SD card/MMC connector, or an audio connector.

In an embodiment, the memory may include a volatile memory or a nonvolatile memory.

In an embodiment, the electronic device 200 may include various other components disposed on the PCB 430 or electrically connected with the PCB 430. For example, the electronic device 200 may include the battery 480 disposed between the first support member 485 and the second support member 425 or between the second support member 425 and the third support member 405. The battery 480, which is a device for supplying power to one or more components of the electronic device 200, for example, may include a primary battery that is not rechargeable, a secondary battery that is rechargeable, or a fuel cell. The battery 480 may be integrally disposed in the electronic device 200 or may be detachably attached to the electronic device 200.

In an embodiment, the electronic device 200 may include an antenna disposed between the first support member 485 and the second support member 425 or between the second support member 425 and the third support member 405. For example, the antenna may include at least one of a near field communication (NFC) antenna, a wireless charging antenna, or a magnetic secure transmission (MST) antenna. The antenna can perform near field communication with external devices or can wirelessly transmit and receive power for charging. In an embodiment, an antenna 410 may be formed by a portion or a combination of the first side cover 213 and/or the second side cover 214.

In describing the electronic device 200 illustrated in FIGS. 4B and 4C according to various embodiments, a construction, a function and/or a structure duplicated those of FIG. 4A will be briefly described or omitted.

Referring to FIG. 4B, illustrating diagram 400, in the state in which the front of the flexible display 230 has been directed toward the z axis direction, a state of the electronic device 200 may be changed from the closed state to the open state based on a movement of the sliding plate 220 to a set distance in a first direction (e.g., the x axis direction), that is, a slide-out direction, by an external force, and may be changed from the open state to the closed state based on a movement of the sliding plate 220 to a set distance in a second direction (e.g., the −x axis direction), that is, a direction opposite to the first direction, by an external force.

In an embodiment, a housing (e.g., the housing 210 in FIG. 2) including a back cover (not illustrated), a first side cover (e.g., the first side cover 213 in FIG. 2) and/or a second side cover (e.g., the second side cover 214 in FIG. 2), a sliding plate (e.g., the sliding plate 220 in FIG. 2), the flexible display 230, the PCB 430 and/or a bendable member 491 may be disposed or coupled to the first support member 485 and/or the second support member 425.

In an embodiment, the bendable member 491 may be rotatably disposed in the internal space of the electronic device 200. The flexible display 230 may be disposed to be supported by the bendable member 491 and the housing 210.

In an embodiment, the electronic device 200 may further include an expansion member 493. The expansion member 493 may be expanded based on a movement of the sliding plate 220 or the flexible display 230 in the second direction (e.g., the −x axis direction). In an embodiment, the expansion member 493 may further include a guide rail (not illustrated) for supporting and guiding a movement of the sliding plate 220.

In an embodiment, the camera module 435, the charging circuit 440, the AP 450, the wireless communication circuit 465, the sliding sensor 470 and/or an interface (e.g., the interface 177 in FIG. 1) may be mounted on the PCB 430. At least one temperature sensor may be mounted on the PCB

430. For example, the at least one temperature sensor may be disposed in an area adjacent to each of the charging circuit 440, the AP 450, the wireless communication circuit 465, and the interface. In an embodiment, the at least one temperature sensor may be disposed in the third support member 405.

At least one temperature sensor according to various embodiments may include first to fifth temperature sensors. For example, the first temperature sensor 413 may be disposed in an area close to the wireless power reception circuit 415. The first temperature sensor 413 can detect a temperature change of the wireless power reception circuit 415. As another example, the second temperature sensor 445 may be disposed in an area close to the charging circuit 440. The second temperature sensor 445 can detect a temperature change of the charging circuit 440. As another example, the third temperature sensor 455 may be disposed in an area close to the AP 450 and can detect a temperature change of the AP 450. As another example, the fourth temperature sensor 460 may be disposed in an area close to the wireless communication circuit 465 and can detect a temperature change of the wireless communication circuit 465. As another example, the fifth temperature sensor 475 may be disposed in an area close to the interface (e.g., a USB connector) and can detect a temperature change of the interface.

In an embodiment, the sliding sensor 470 may include a magnetic force sensor that senses a magnetic force that varies in accordance with the distance from a magnetic substance (e.g., a magnet) disposed on the PCB 430.

Referring to FIG. 4C, illustrating diagram 400, in the state in which the front of the flexible display 230 has been directed toward the −z axis direction, a state of the electronic device 200 may be changed from the closed state to the open state based on a movement of the sliding plate 220 to a set distance in a first direction (e.g., the x axis direction), that is, a slide-out direction, by an external force, and may be changed from the open state to the closed state based on a movement of the sliding plate 220 to a set distance in a second direction (e.g., the −x axis direction), that is, a direction opposite to the first direction.

In an embodiment, a housing (e.g., the housing 210 in FIG. 2) including a back cover 401, a first side cover (e.g., the first side cover 213 in FIG. 2) and a second side cover (e.g., the second side cover 214 in FIG. 2), a sliding plate (e.g., the sliding plate 220 in FIG. 2), the flexible display 230, the PCB 430 (e.g., main PBA(printed board assembly) and the bendable member 491 may be disposed on or coupled to at least one of the first support member 485 or the second support member 425.

In an embodiment, the bendable member 491 may be rotatably disposed in the internal space of the electronic device 200. The flexible display 230 may be disposed to be supported by the bendable member 491 and the housing 210.

In an embodiment, the bendable member 491 may include at least one resilient structure 492. When the sliding plate 220 is moved to a set distance by an external force, a state of the electronic device 200 may be changed from the closed state in FIG. 2 to the open state in FIG. 3 or from the open state to the closed state even without a further external force due to the at least one resilient structure 492. For example, the at least one resilient structure 492 may include various resilient members such as a torsion spring. For example, the torsion spring as the at least one resilient structure 492 may include one end connected to the sliding plate 220, the other end connected to the first support member 485, and a spring part between the one end and the other end. When the sliding plate 220 is moved to a set distance in a first direction (e.g., the −x axis direction), that is, a slide-out direction, by an external force, a location of the one end is changed with respect to a location of the other end. Accordingly, the sliding plate 220 may be moved in the first direction due to the resilience of the spring part even without a further external force, and thus a state of the electronic device 200 may be changed from the closed state in FIG. 2 to the open state in FIG. 3. When the sliding plate 220 is moved to a set distance in a second direction (e.g., the x axis direction), that is, a direction opposite to the first direction, by an external force, a location of the one end is changed with respect to a location of the other end. Accordingly, the sliding plate 220 may be moved in the second direction due to the resilience of the spring part even without a further external force, and thus a state of the electronic device 200 may be changed from the open state in FIG. 3 to the closed state in FIG. 2.

In an embodiment, the camera module 435, the charging circuit 440, the AP 450, the wireless communication circuit 465, the sliding sensor 470 and/or an interface (e.g., the interface 177 in FIG. 1) may be mounted on the PCB 430. At least one temperature sensor may be mounted on the PCB 430. At least one temperature sensor according to various embodiments may include first to fifth temperature sensors. For example, the first temperature sensor 413 may be disposed in an area close to the wireless power reception circuit 415. The first temperature sensor 413 can detect a temperature change of the wireless power reception circuit 415. As another example, the second temperature sensor 445 may be disposed in an area close to the charging circuit 440. The second temperature sensor 445 can detect a temperature change of the charging circuit 440. As another example, the third temperature sensor 455 may be disposed in an area close to the AP 450 and can detect a temperature change of the AP 450. As another example, the fourth temperature sensor 460 may be disposed in an area close to the wireless communication circuit 465 and can detect a temperature change of the wireless communication circuit 465. As another example, the fifth temperature sensor 475 may be disposed in an area close to the interface (e.g., a USB connector) and can detect a temperature change of the interface.

In an embodiment, the sliding sensor 470 may include a magnetic force sensor for sensing a magnetic force that varies depending on a separation distance from a magnetic body (e.g., a magnet) disposed in the PCB 430.

Figure 4D:
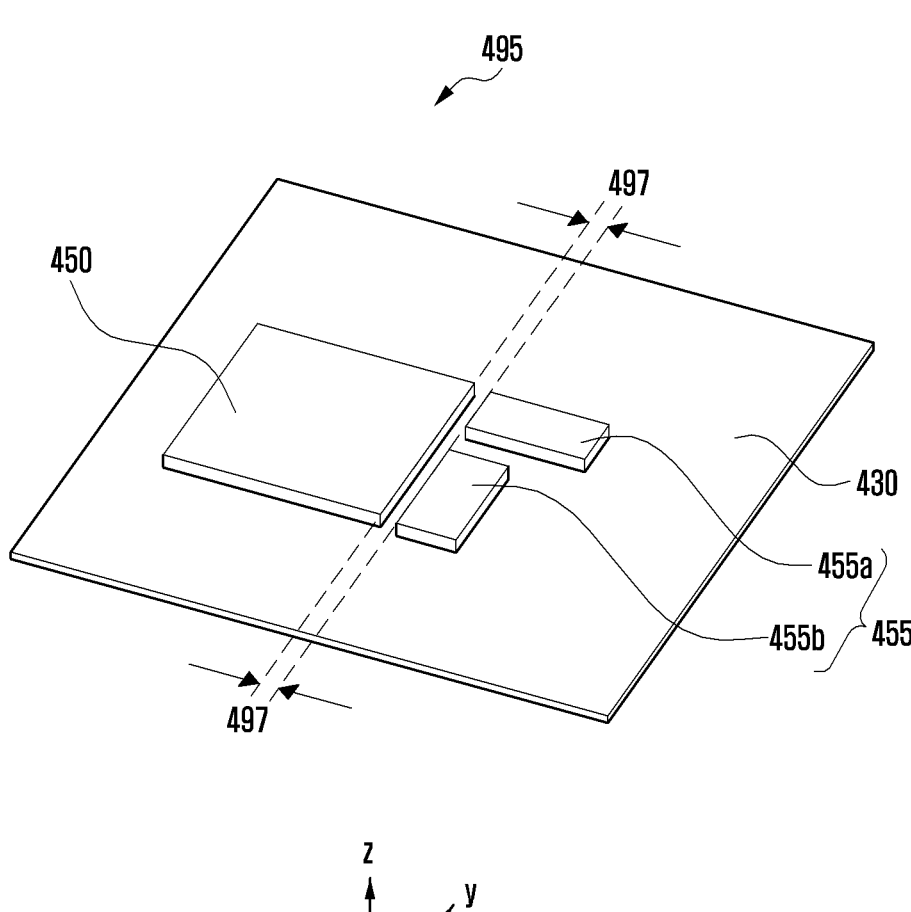
FIG. 4D is a diagram for describing an arrangement of at least one heating element and at least one temperature sensor according to an embodiment of the disclosure.

FIG. 4D comprises a diagram 495 for describing the arrangement of at least one heating element and at least one temperature sensor according to various embodiments.

In various embodiments, at least one heating element may be disposed on the PCB 430.

Referring to FIG. 4D, an AP 450 is assumed and described as being at least one heating element. Referring to FIG. 4D, the AP 450 and a third temperature sensor 455 for detecting a change in the temperature of the AP 450 may be disposed on a PCB 430. The third temperature sensor 455 may include a plurality of third temperature sensors 455a and 455b. The plurality of third temperature sensors 455a and 455b may be disposed in an area adjacent to the AP 450. For example, the plurality of third temperature sensors 455a and 455b may be disposed in an adjacent area having a specific interval 497 (e.g., 1 mm) from the AP 450. In an embodiment, the plurality of third temperature sensors 455a and 455b may be disposed in a first direction (e.g., an x axis direction) and/or may be disposed in a second direction (e.g., a y axis direction).

Referring to FIG. 4D, the heating element has been assumed and described as being the AP, but the disclosure is not limited thereto. For example, the heating element may include the wireless power reception circuit 415, the charging circuit 440, the wireless communication circuit 465 and/or an interface (e.g., a USB connector). The temperature sensor for measuring a change in the temperature of each heating element may also be disposed in an adjacent area having the specific interval 497 (e.g., 1 mm) from each heating element.

According to various embodiments, although not illustrated, those skilled in the art may easily understand that at least one temperature sensor may be included in a heating element or may be disposed on a surface of the heating element.

In various embodiments, each temperature sensor may be disposed in the PCB 430, the second support member 425 and/or the third support member 405 depending on a location of each heating element.

Figure 5A:
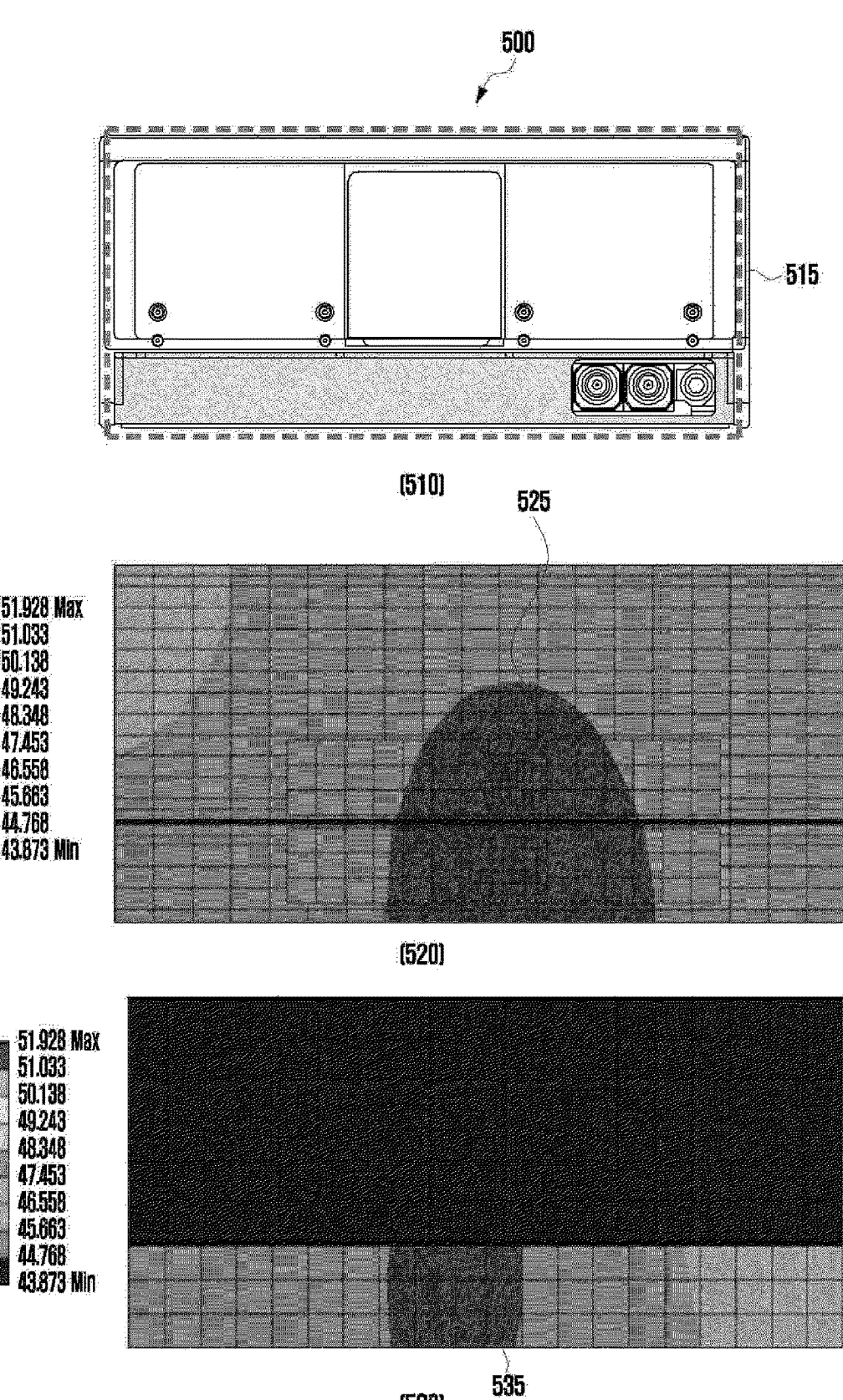
FIG. 5A is a diagram for describing a degree of generation of heat of at least one heating element measured in a first state in an electronic device according to an embodiment of the disclosure.

FIG. 5A comprises a diagram describing a degree of generation of heat of at least one heating element measured in a first state in an electronic device according to an embodiment of the disclosure.

FIG. 5B comprises a diagram describing a degree of generation of heat of at least one heating element measured in a second state in an electronic device according to an embodiment of the disclosure.

In various embodiments, a heat discharge structure may be different depending on a state (e.g., a first state (e.g., the closed state in FIG. 2) and a second state (e.g., the open state in FIG. 3)) of an electronic device (e.g., the electronic device 200 in FIG. 2).

Referring to FIG. 5A, a diagram 500 illustrates temperature distributions (e.g., reference numerals <520> and <530>) within an area 515 of an electronic device 200, which were measured when heat was generated from the AP 450 because the electronic device 200 illustrated in reference numeral <510> performed a function related to at least one heating element, for example, an AP (e.g., the AP 450 in FIGS. 4A, 4B, 4C, and 4D) in a first state (e.g., the closed state in FIG. 2). For example, reference numeral <520> is a diagram illustrating a temperature distribution within the area 515 of the electronic device 200, which was measured when a state of the electronic device 200 was the first state and in the state in which the flexible display 230 was directed toward the −z axis direction. Reference numeral <530> is a diagram illustrating a temperature distribution within the area 515 of the electronic device 200, which was measured when a state of the electronic device 200 was the first state and in the state in which the flexible display 230 was directed toward the z axis direction.

In various embodiments, when a state of the electronic device 200 is a first state (e.g., the closed state in FIG. 2), a temperature of the AP 450 disposed within the electronic device 200 may rapidly rise because generated heat is not discharged due to a sealing insulation effect of a support member assembly (e.g., a second support member (e.g., the second support member 425 in FIGS. 4A, 4B, and 4C), a third support member (e.g., the third support member 405 in FIGS. 4A and 4C)), or the back cover (not illustrated).

For example, a temperature of the AP 450 before the AP 450 generates heat is assumed and described as being about 25° C. As the electronic device 200 does not discharge heat generated from the AP 450 in the first state, a temperature of a heating area 525 or 535 including an area where the AP 450 is disposed may rise from about 25° C. to about 51.9° C., for example, as illustrated in reference numerals <520> and <530>.

Referring to FIG. 5B, a diagram 550 illustrates temperature distributions (e.g., reference numerals <570> and <580>) within an area 565 of the electronic device 200, which were measured when heat was generated from the AP 450 because the electronic device 200 illustrated in reference numeral <560> performed a function related to at least one heating element, for example, the AP 450 in a second state (e.g., the open state in FIG. 3). For example, reference numeral <570> is a diagram illustrating a temperature distribution within the area 565 of the electronic device 200 when a state of the electronic device 200 was changed into the second state and in the state in which the flexible display 230 was directed toward the −z axis direction. Reference numeral <580> is a diagram illustrating a temperature distribution within the area 565 of the electronic device 200, which was measured when a state of the electronic device 200 was changed into the second state and in the state in which the flexible display 230 was directed toward the z axis direction.

In various embodiments, when a state of the electronic device 200 is changed into a second state (e.g., the open state in FIG. 3), a support member assembly (e.g., a first support member (e.g., the first support member 485 in FIGS. 4A, 4B, and 4C) and a second support member (e.g., the second support member 425 in FIGS. 4A, 4B, and 4C)) or a flexible display (e.g., the flexible display 230 in FIG. 2) may be moved by a slid-out operation. As the first and second support members 485 and 425 and the flexible display 230 are moved, heat may be discharged to the outside, and a temperature of the AP 450 may be lowered.

For example, when a state of the electronic device 200 is changed into the second state, as the first and second support members 485 and 425 and the flexible display 230 are moved, heat may be discharged to the outside, and a temperature of heating areas 575 and 585 including an area where the AP 450 is disposed may be lowered from about 51.9° C. to about 47° C., for example, as illustrated in reference numeral <570> and <580>.

In various embodiments, when a state of the electronic device 200 is changed into the second state, as heat generated from the AP 450 is discharged to the outside, the heating area 575 or the heating area 585 including the area where the AP 450 is disposed may be reduced compared to the heating area 525 or 535 in the first state.

In various embodiments, the electronic device 200 may control at least one heating element, having a temperature higher than a designated temperature, to operate according to a different execution policy based on a state of the electronic device 200 by using a construction having a different heat discharge characteristic in response to a state of the electronic device 200 illustrated in FIGS. 5A and 5B.

In various embodiments, an execution policy may include information indicative of an operation of at least one heating element, which is mapped to a state (e.g., a first state (e.g., the closed state in FIG. 2) or a second state (e.g., the open state in FIG. 3)) of the electronic device 200 and/or a temperature and stored, and may include data having a table form, for example. The execution policy may be stored in a memory (e.g., the memory 130 in FIG. 1) of the electronic device 200.

In various embodiments, an execution policy may include a program instruction itself which enables an operation based on a state and/or temperature of the electronic device 200.

In relation to a construction that controls at least one heating element to operate according to a different execution policy based on the state of the electronic device 200 and a temperature of the at least one heating element, various embodiments will be described with reference to FIGS. 6 to 13 to be described later.

Figure 6:
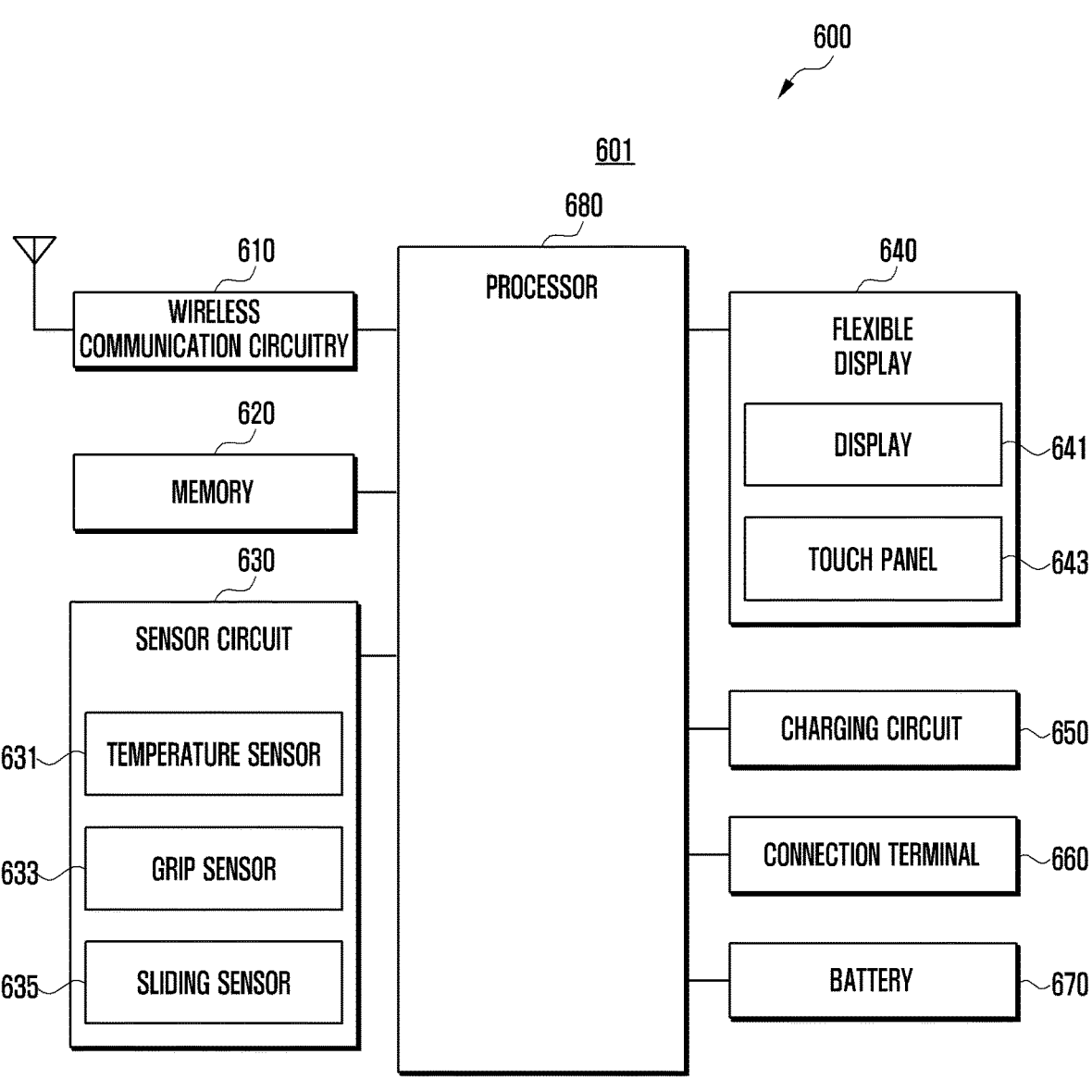
FIG. 6 is a diagram illustrating an electronic device according to an embodiment of the disclosure.

FIG. 6 is a diagram illustrating an electronic device according to an embodiment of the disclosure.

Referring to FIG. 6, illustrating diagram 600, an electronic device 601 (e.g., electronic device 101 in FIG. 1, electronic device 200 in FIG. 2) may include wireless communication circuitry 610 (e.g., the communication module 190 in FIG. 1), a memory 620 (e.g., the memory 130 in FIG. 1), a sensor circuit 630 (e.g., the sensor module 176 in FIG. 1), a flexible display 640 (e.g., the display module 160 in FIG. 1, the flexible display 230 in FIG. 2), a charging circuit 650 (e.g., the power management module 188 in FIG. 1), a connection terminal 660 (e.g., the connection terminal 178 in FIG. 1), a battery 670 (e.g., the battery 189 in FIG. 1) and/or a processor 680 (e.g., the processor 120 in FIG. 1).

According to various embodiments of the disclosure, the wireless communication circuitry 610 (e.g., the communication module 190 in FIG. 1) may support that a communication channel with an external electronic device (e.g., the external electronic device 102 in FIG. 1) is established and various data is transmitted and received to and from the external electronic device.

According to various embodiments of the disclosure, the memory 620 (e.g., the memory 130 in FIG. 1) may store a temperature of at least one heating element obtained from at least one temperature sensor 631. The memory 620 may store a sensor value for identifying a state (e.g., a first state (e.g., the closed state in FIG. 2), a second state (e.g., the open state in FIG. 3), or a third state (e.g., an intermediate state between the closed state and the open state and/or a grip state) of the electronic device 601. The memory 620 may store values of a plurality of designated temperatures, that is, a basis for controlling an operation signal of at least one heating element, based on a state of the electronic device 601. The memory 620 may store a plurality of execution policies for controlling an operation signal of at least one heating element based on a state of the electronic device 601 and/or a temperature of the at least one heating element. The memory 620 may store a mapping table in which a state of the electronic device 601 and/or a temperature of at least one heating element and a plurality of execution policies are mapped. The memory 620 may store a plurality of execution policies for controlling an operation signal of at least one heating element as information or a program instruction itself, which is related to an operation of the at least one heating element, based on a state of the electronic device 601 and/or a temperature of the at least one heating element.

According to various embodiments of the disclosure, the sensor circuit 630 (e.g., the sensor module 176 in FIG. 1) may include the at least one temperature sensor 631, at least one grip sensor 633, and a sliding sensor 635.

In an embodiment, the at least one temperature sensor 631 may be disposed adjacent to each of at least one heating element or may be included in each of the at least one heating element. The at least one temperature sensor 631 may include a thermistor. Resistance of the thermistor may vary depending on a temperature. The electronic device 601 may measure a temperature of a corresponding heating element based on a change in resistance of the thermistor.

In an embodiment, the at least one temperature sensor 631 may be disposed adjacent to a path for discharging heat generated by at least one heating element, and may measure a surface temperature of the electronic device 601.

In an embodiment, the at least one grip sensor 633 may detect the grip state of the electronic device 601. In an embodiment, the at least one grip sensor 633 may be connected to a path for discharging heat generated by at least one heating element.

In an embodiment, the sliding sensor 635 (e.g., the sliding sensor 470 in FIGS. 4A, 4B, and 4C) may include a sensor for detecting a slide-out degree of the flexible display 230 from the housing 210. For example, the sliding sensor 635 may include a hall sensor (or a magnetic sensor). The hall sensor may detect a state (e.g., the first state, the second state, or the third state) of the electronic device 601.

According to various embodiments of the disclosure, the flexible display 640 (e.g., the display module 160 in FIG. 1) may be configured in an integrated type including a display 641 and a touch panel 643.

In an embodiment, the flexible display 640 displays an image under the control of the processor 680, and may be implemented as any one of a liquid crystal display (LCD), a light-emitting diode (LED) display, an organic light-emitting diode (OLED) display, a micro electro mechanical systems (MEMS) display, or an electronic paper display, but the disclosure is not limited thereto.

In an embodiment, the flexible display 640 may be implemented so that a part thereof (e.g., the bendable section ② in FIG. 3) can be drawn from the internal space of the electronic device 601. For example, when a state of the electronic device 601 is changed from a first state (e.g., the closed state in FIG. 2) to a second state (e.g., the open state in FIG. 3), the bendable section ② of the flexible display 640 may be drawn from the internal space of the electronic device 601 as if it slides, so that a screen (e.g., the screen 2301 in FIG. 2) may be expanded. When a state of the electronic device 601 is changed from a second state (e.g., the open state in FIG. 3) to a first state (e.g., the closed state in FIG. 2), the bendable section ② may enter the internal space of the electronic device 601 as if it slides, so that the screen 2301 may be downsized.

In an embodiment, when a temperature of at least one heating element related to a specific function is higher than a designated temperature due to the execution of the specific function by the electronic device 601 in a first state (e.g., the closed state in FIG. 2), the flexible display 640 may display a notification message for guiding the execution of a specific function or a notification message for a changed execution policy in a second state (e.g., the open state in FIG. 3) under the control of the processor 680.

According to various embodiments of the disclosure, the charging circuit 650 (e.g., the power management module 188 in FIG. 1) may be electrically connected to a wireless power reception circuit (e.g., the wireless power reception circuit 415 in FIGS. 4A, 4B, and 4C) and the connection terminal 660 (e.g., a USB connector (not illustrated)). The charging circuit 650 may receive, through the wireless power reception circuit 415 or the connection terminal 660, power transmitted by a charging device (not illustrated), and may supply power to the battery 670.

According to various embodiments of the disclosure, the connection terminal 660 (e.g., the connection terminal 178 in FIG. 1) may include a connector which may be physically connected to an external electronic device (e.g., the external electronic device 102). For example, the connection terminal 178 may include an HDMI connector, a USB connector, an SD card connector, or an audio connector (e.g., a headphone connector).

According to various embodiments of the disclosure, the processor 680 (e.g., the processor 120 in FIG. 1) may control an overall operation of the electronic device 601 and a signal flow between internal components of the electronic device 601, and may perform data processing.

In an embodiment, the processor 680 may identify a temperature of at least one heating element, which is obtained through the at least one temperature sensor 631 when a state of the electronic device 601 is a first state (e.g., the closed state in FIG. 2). The at least one heating element may include at least one of the processor 680 (e.g., an AP), the communication circuitry 610, the charging circuit 650, or the connection terminal 660. The processor 680 may identify a temperature of at least one heating element, which is obtained through the at least one temperature sensor 631 disposed adjacent to each of the at least one heating element. The processor 680 may control at least one heating element, having a temperature higher than a first designated temperature, to operate according to a first execution policy based on a temperature of the at least one heating element. For example, the processor 680 may control at least one heating element, having a temperature higher than a first designated temperature, to have a lowered temperature or to operate according to a first execution policy having lower performance than an execution policy for a function of at least one heating element, which is now being executed.

In an embodiment, when a state of the electronic device 601 is changed into a second state (e.g., the open state in FIG. 3), the processor 680 may control at least one heating element, operating according to a first execution policy, to operate according to a second execution policy. For example, the second execution policy may include a policy having higher performance than the first execution policy.

In an embodiment, the processor 680 may perform an operation of identifying whether a state of the electronic device 601 is the grip state when a state of the electronic device 601 is changed into the second state. For example, the electronic device 601 may identify whether a state of a user is a state in which the user has gripped the electronic device 601 (or the state in which the user has touched the electronic device 601) based on the at least one grip sensor 633 connected to a path for discharging heat generated by at least one heating element and/or the at least one temperature sensor 631 disposed adjacent to the path for discharging heat. When a state of the electronic device 601 is the grip state, the processor 680 may control at least one heating element, operating according to a first execution policy, to operate according to a third execution policy. For example, the third execution policy may include a policy having lower performance than the second execution policy and higher performance than the first execution policy.

The electronic device 601 according to various embodiments may include the housing 210, the sliding plate 220 capable of sliding out from the housing 210, the flexible display 640 including a bendable section (e.g., the bendable section ② in FIG. 3) overlappingly coupled to the sliding plate 220 and drawable from the internal space of the housing 210, the multi-bar structure 490 supporting a bendable section (e.g., the bendable section ② in FIG. 3) of the flexible display 640, the sensor circuit 630 for detecting a first state in which at least a part of a bendable section (e.g., the bendable section ② in FIG. 3) enters the internal space of the housing 210 due to a slide-in of the sliding plate 220 or a second state in which at least a part of a bendable section (e.g., the bendable section ② in FIG. 3) is drawn to the external space of the housing 210 due to a slide-out of the sliding plate 220, the at least one temperature sensor 631 disposed adjacent to at least one heating element, and the processor 680 operatively coupled to the sensor circuit 630 and the at least one temperature sensor 631. The processor 680 may be configured to obtain a temperature of at least one heating element through the at least one temperature sensor 631, to identify at least one heating element having a temperature higher than a designated temperature based on the obtained temperature of the at least one heating element, and to control the at least one heating element, having the temperature higher than the designated temperature, to operate according to a first execution policy, in the first state.

According to various embodiments, the at least one heating element may include at least one of the processor 680, the communication circuitry 610, the charging circuit 650, the battery 670, or the connection terminal 660.

According to various embodiments, when a change in the state of the electronic device 601 from the first state to the second state is detected, the processor 680 may control at least one heating element, operating according to a first execution policy, to operate according to a second execution policy.

According to various embodiments, the second execution policy may include a policy higher performance than the first execution policy.

According to various embodiments, when the at least one heating element is the processor 680, the first execution policy may include a policy for reducing a maximum clock of a CPU and/or a GPU and/or a frame per second (FPS). The second execution policy may include a policy for increasing a maximum clock of a CPU and/or a GPU higher than a maximum clock of the first execution policy and/or increasing the FPS higher than an FPS of the first execution policy.

According to various embodiments, when the at least one heating element is the communication circuitry 610, the first execution policy may include a policy for decreasing a data transfer rate and/or power. The second execution policy may include a policy for increasing the data transfer rate and/or the power higher than a data transfer rate and/or power of the first execution policy.

According to various embodiments, when the at least one heating element is the charging circuit 650, the battery 670 and/or the connection terminal 660, the first execution policy may include a policy for decreasing a charging current. The second execution policy may include a policy for increasing the charging current higher than a charging current of the first execution policy.

According to various embodiments, in the second state, the processor 680 may obtain a temperature of at least one heating element through the at least one temperature sensor 631, may identify at least one heating element having a temperature higher than a second designated temperature based on the obtained temperature of the at least one heating element, and may control the at least one heating element, having the temperature higher than the second designated temperature, to operate according to a third execution policy.

According to various embodiments, the third execution policy may include a policy having lower performance than the second execution policy and higher performance than the first execution policy.

According to various embodiments, when a change in the state of the electronic device 601 into the second state is detected, the processor 680 may be configured to identify the grip state of the electronic device 601.

According to various embodiments, the processor 680 may be configured to identify the grip state of the electronic device based on the at least one grip sensor 633 connected to a heat discharge path of the at least one heating element and/or the at least one temperature sensor 631 disposed in the heat discharge path of the at least one heating element.

According to various embodiments, when a state of the electronic device 601 is identified to be the grip state, the processor 680 may control at least one heating element, operating according to the first execution policy, to operate according to the third execution policy.

According to various embodiments, the third execution policy may include a policy for changing performance at designated time intervals within a designated performance range and controlling the at least one heating element to operate with the changed performance.

According to various embodiments, the processor 680 may obtain a surface temperature of the electronic device 601 through the at least one temperature sensor 631 disposed in a heat discharge path of at least one heating element, and may control the at least one heating element to operate according to the third execution policy until the surface temperature of the electronic device 601 reaches a third designated temperature.

According to various embodiments, when a state of the electronic device 601 is identified to be not the grip state, the processor 680 may control at least one heating element, operating according to the first execution policy, to operate according to the second execution policy.

According to various embodiments, the processor 680 may be configured to control the flexible display 640 to display a notification message related to an execution policy controlled based on a state of the electronic device 601 or a notification message for inducing the use of the electronic device 601 in the second state when the at least one heating element operates according to the first execution policy.

The electronic device 601 according to various embodiments may include the housing 210, the sliding plate 220 capable of sliding out from the housing 210, the flexible display 640 including a bendable section overlappingly coupled to the sliding plate 220 and drawable from the internal space of the housing 210, the multi-bar structure 490 supporting the bendable section of the flexible display 640, the sensor circuit 630 for detecting a first state in which at least a part of the bendable section enters the internal space of the housing 210 due to a slide-in of the sliding plate 220 or a second state in which at least a part of the bendable section is drawn to the external space of the housing 210 due to a slide-out of the sliding plate 220, the at least one temperature sensor 631 disposed adjacent to at least one heating element, the memory 620 storing a first execution policy, a second execution policy, and a third execution policy operating based on the first state, the second state and/or a temperature of the at least one heating element, and the processor 680 operatively coupled to the sensor circuit 630, the at least one temperature sensor 631, and the memory 620. The processor 680 may be configured to control at least one heating element, having a temperature higher than a first designated temperature, to operate according to the first execution policy based on a temperature of the at least one heating element obtained through the at least one temperature sensor 631 in the first state, to control the at least one heating element, operating according to the first execution policy and having the temperature higher than the first designated temperature, to operate according to the second execution policy having higher performance than the first execution policy based on a change in the state of the electronic device 601 from the first state to the second state, to identify at least one heating element having a temperature higher than a second designated temperature based on a temperature of at least one heating element obtained through the at least one temperature sensor 631 in the second state, and to control the at least one heating element, operating according to the second execution policy and having the temperature higher than the second designated temperature, to operate according to the third execution policy.

FIG. 7 is a flowchart describing a method of controlling a temperature based on a state of an electronic device according to an embodiment of the disclosure.

Referring to FIG. 7, illustrating flowchart 700, at operation 710, a processor (e.g., the processor 680 in FIG. 6) of an electronic device (e.g., the electronic device 601 in FIG. 6) may identify a temperature of at least one heating element obtained through at least one temperature sensor (e.g., the at least one temperature sensor 631 in FIG. 6) when a state of the electronic device 601 is a first state.

In an embodiment, a first state (e.g., the closed state in FIG. 2) of the electronic device 601 may include the state in which at least a part of a bendable section (e.g., the bendable section ② in FIG. 3) of a flexible display (e.g., the flexible display 230 in FIGS. 2 and 3 or the flexible display 640 in FIG. 6) enters the internal space of the housing 210 due to a slide-in of a sliding plate (e.g., the sliding plate 220 in FIG. 2) capable of sliding out from a housing (e.g., the housing 210 in FIG. 2) of the electronic device 601.

In an embodiment, the electronic device 601 may identify whether a state of the electronic device 601 is the first state through a sensor circuit (e.g., the sensor circuit 630 in FIG. 6). For example, the sensor circuit 630 may include a sliding sensor (e.g., the sliding sensor 635 in FIG. 6). The electronic device 601 may identify whether a state of the electronic device 601 is the first state based on a slide-out degree from the housing 210 detected through the sliding sensor 635.

In an embodiment, at least one heating element may include at least one of an AP (e.g., the processor 680 in FIG. 6), communication circuitry (e.g., the wireless communication circuitry 610 in FIG. 6), a charging circuit (e.g., the charging circuit 650 in FIG. 6), or a connection terminal (e.g., the connection terminal 660 in FIG. 6).

In an embodiment, the at least one temperature sensor 631 may be disposed adjacent to each of at least one heating element or may be included in each of the at least one heating element. For example, the at least one temperature sensor 631 may include a first temperature sensor (e.g., the first temperature sensor 413 in FIGS. 4A, 4B, and 4C) for measuring a temperature of a wireless power reception circuit (e.g., the wireless power reception circuit 415 in FIGS. 4A, 4B, and 4C), a second temperature sensor (e.g., the second temperature sensor 445 in FIGS. 4A, 4B, and 4C) for measuring a temperature of the charging circuit 650, a third temperature sensor (e.g., the third temperature sensor 455 in FIGS. 4A, 4B, 4C and 4D) for measuring a temperature of the processor 680, a fourth temperature sensor (e.g., the fourth temperature sensor 460 in FIGS. 4A, 4B, and 4C) for measuring a temperature of the wireless communication circuitry 610 and/or the fifth temperature sensor 475 for measuring a temperature of an interface (e.g., a USB connector).

In an embodiment, the at least one temperature sensor 631 disposed adjacent to each of at least one heating element may measure a temperature of the corresponding heating element, and may transmit the measured temperature to the processor 680. In an embodiment, the at least one temperature sensor 631 may measure a temperature of at least one heating element at designated time intervals. The processor 680 may store, in a memory (e.g., the memory 620 in FIG.

6), the temperature information of the at least one heating element received from the at least one temperature sensor 631.

In an embodiment, at operation 720, the processor 680 may identify at least one heating element having a temperature higher than a designated temperature based on the temperature of the at least one heating element. At operation 730, the processor 680 may control the at least one heating element, having the temperature higher than the designated temperature, to operate according to a first execution policy.

In an embodiment, a temperature of at least one heating element disposed within the electronic device 601 may rapidly rise when a state of the electronic device 601 is the first state, for example, due to sealing and insulation according to the entry of at least a part of a bendable section (e.g., the bendable section ② in FIG. 3) of the flexible display 640 into the internal space of the housing 210. Accordingly, when a state of the electronic device 601 is the first state, if at least one heating element having a temperature higher than a designated temperature is present, the processor 680 may control the at least one heating element, having the temperature higher than the designated temperature, to operate according to a first execution policy. For example, the processor 680 may control the at least one heating element to have a temperature lower than the temperature of the at least one heating element higher than the designated temperature or to operate according to the first execution policy having lower performance than an execution policy for a function of at least one heating element, which is now being executed.

The processor 680 (e.g., an AP) is assumed and described as being at least one heating element having a temperature higher than a designated temperature according to various embodiments. For example, the processor 680 may execute a function, such as game, image editing and/or image photographing based on a user input. The processor 680 may obtain a temperature of the processor 680 through a temperature sensor disposed adjacent to the processor 680, for example, the third temperature sensor 455. The processor 680 may identify whether a temperature of the processor 680 is higher than a designated temperature based on a temperature obtained through the third temperature sensor 455. When the temperature of the processor 680 is higher than the designated temperature, the processor 680 may control to operate according to a first execution policy having lower performance than an execution policy now being executed. For example, when at least one heating element is the processor 680, the first execution policy may include a policy for reducing a maximum clock of a CPU and/or a GPU and/or a frame per second (FPS). As the processor 680 operates according to the first execution policy, a load of the processor 680 can be reduced. As the load of the processor 680 is reduced, the temperature of the processor 680 can be lowered.

In another embodiment, the wireless communication circuitry 610 is assumed and described as being at least one heating element having a temperature higher than a designated temperature. For example, the processor 680 may execute a function, such as the download of a large amount of data and/or a streaming image output, based on a user input. The processor 680 may obtain a temperature of the wireless communication circuitry 610 through a temperature sensor disposed adjacent to the wireless communication circuitry 610, for example, the fourth temperature sensor 460. The processor 680 may identify whether a temperature of the wireless communication circuitry 610 is higher than a designated temperature based on a temperature obtained through the fourth temperature sensor 460. When the temperature of the wireless communication circuitry 610 is higher than the designated temperature, the processor 680 may control the wireless communication circuitry 610 to operate according to a first execution policy having lower performance than an execution policy now being executed. For example, when at least one heating element is the wireless communication circuitry 610, the first execution policy may include a policy for reducing a data transfer rate and/or power for reducing the throughput of data. As the wireless communication circuitry 610 operates according to the first execution policy under the control of the processor 680, a current consumed by the wireless communication circuitry 610 can be reduced. As the current consumed by the wireless communication circuitry 610 is reduced, a temperature of the wireless communication circuitry 610 can be lowered.

In still another embodiment, the wireless power reception circuit 415, the charging circuit 650 and/or the battery 670 is assumed and described as being at least one heating element having a temperature higher than a designated temperature. For example, while the battery 670 is charged in a wireless or wired way, the processor 680 may execute a function, such as the Internet, a call and/or game, based on a user input. The processor 680 may obtain a temperature of the wireless power reception circuit 415, the charging circuit 650 and/or the battery 670 through a temperature sensor disposed adjacent to the wireless power reception circuit 415, the charging circuit 650 and/or the battery 670, for example, through the first temperature sensor 413, the second temperature sensor 445 and/or the fifth temperature sensor 475. The processor 680 may identify whether a temperature of the wireless power reception circuit 415, the charging circuit 650 and/or the battery 670 is higher than a designated temperature based on a temperature obtained through the first temperature sensor 413, the second temperature sensor 445 and/or the fifth temperature sensor 475. When the temperature of the wireless power reception circuit 415, the charging circuit 650 and/or the battery 670 is higher than the designated temperature, the processor 680 may control the wireless power reception circuit 415, the charging circuit 650 and/or the battery 670 to operate according to a first execution policy having lower performance than an execution policy now being executed. For example, when at least one heating element is the wireless power reception circuit 415, the charging circuit 650 and/or the battery 670, the first execution policy may include a policy for reducing a charging current. For example, the processor 680 may reduce a charging current of the battery 670 from 1.3 C to 1.0 C or from 1.0 C to 0.7 C, but the disclosure is not limited thereto. As the wireless power reception circuit 415 and/or the charging circuit 650 operates according to the first execution policy under the control of the processor 680, a temperature of the wireless power reception circuit 415, the charging circuit 650 and/or the battery 670 can be lowered.

In various embodiments, although not illustrated, if a state of the electronic device 601 is the first state, when a temperature of at least two heating elements is higher than a designated temperature, an operation of a function related to the at least two heating elements having the temperature higher than the designated temperature may be controlled. For example, when at least two heating elements having a temperature higher than a designated temperature are the processor 680 and the wireless communication circuitry 610, the processor 680 may control the processor 680 to operate according to a first execution policy (e.g., a policy for reducing a maximum clock of a CPU and/or a GPU and/or a frame per second (FPS)) having lower performance than an execution policy now being executed and the wireless communication circuitry 610 to operate according to a first execution policy (e.g., a policy for reducing a data transfer rate and/or power for reducing the throughput of data) having lower performance than an execution policy now being executed.

In an embodiment, at operation 740, the processor 680 may identify whether the first state of the electronic device 601 is switched to a second state.

In an embodiment, a second state (e.g., the open state in FIG. 3) of the electronic device 601 may include the state in which at least a part of a bendable section (e.g., the bendable section ② in FIG. 3) of the flexible display 640 has been drawn from the internal space of the housing 210 due to a slide-out of the sliding plate 220 capable of sliding out from the housing 210 of the electronic device 601.

In an embodiment, the processor 680 may detect whether a state of the electronic device 601 has changed from the first state to the second state through the sensor circuit 630. For example, the sensor circuit 630 may include the sliding sensor 635, for example, a hall sensor and/or a magnetic sensor. The electronic device 601 may detect, through the sliding sensor 635, a slide-out degree (e.g., the expansion state of the screen 2301 in FIGS. 2 and 3) from the housing 210 based on a magnetic force that varies depending on a separation distance from a magnet (not illustrated) disposed in a first support member (e.g., the first support member 485 in FIGS. 4A, 4B, and 4C). The processor 680 may identify whether a state of the electronic device 601 has changed from the first state to the second state based on a magnetic force.

The disclosure is not limited to such an embodiment. For example, at least one pixel of the flexible display 640 may be configured as a photodiode. The processor 680 may identify a slide-out degree (e.g., an expansion state of the screen 2301 in FIGS. 2 and 3) of a bendable section (e.g., the bendable section ② in FIG. 3) of the flexible display 640 based on at least one photodiode constituting the flexible display 640. The processor 680 may identify whether a state of the electronic device 601 has changed from the first state to the second state based on a slide-out degree (e.g., the expansion state of the screen 2301 in FIGS. 2 and 3) of a bendable section (e.g., the bendable section ② in FIG. 3) of the flexible display 640.

For another example, the flexible display 640 may include a dielectric material. The processor 680 may detect a change in a capacitance value based on the dielectric material included in the flexible display 640. The processor 680 may identify a slide-out degree (e.g., the expansion state of the screen 2301 in FIGS. 2 and 3) of a bendable section (e.g., the bendable section ② in FIG. 3) based on a change in a capacitance value. The processor 680 may identify whether a state of the electronic device 601 has changed from the first state to the second state based on a slide-out degree (e.g., the expansion state of the screen 2301 in FIGS. 2 and 3) of a bendable section (e.g., the bendable section ② in FIG. 3) of the flexible display 640.

Furthermore, for another example, the processor 680 may detect a slide-out degree (e.g., the expansion state of the screen 2301 in FIGS. 2 and 3) of a bendable section (e.g., the bendable section ② in FIG. 3) of the flexible display 640 based on the rotation of a pulley (not illustrated).

In an embodiment, when the first state of the electronic device 601 is switched to the second state (e.g., YES at operation 740), at operation 750, the processor 680 may control at least one heating element, operating according to the first execution policy, to operate according to a second execution policy.

In an embodiment, as a state of the electronic device 601 is switched to the second state, for example, as at least a part of a bendable section (e.g., the bendable section ② in FIG. 3) of the flexible display 640 is drawn from the internal space of the housing 210, heat is discharged and a temperature of at least one heating element may be lowered compared to the first state (e.g., refer to FIG. 5B). Based on the change, the processor 680 may control the at least one heating element, operating according to a first execution policy, to operate according to a second execution policy including a policy having higher performance than the first execution policy. For example, when a state of the electronic device 601 is changed into the second state, a temperature of at least one heating element may be lowered, and the processor 680 may control the at least one heating element to operate according to a second execution policy having higher performance than the first execution policy.

The processor 680 is assumed and described as being at least one heating element operating according to a first execution policy according to various embodiments. A second execution policy may include a policy for increasing a maximum clock of a CPU and/or a GPU higher than that of a first execution policy and/or a frame per second (FPS). As the processor 680 operates according to the second execution policy, performance of the processor 680 can be improved.

In another embodiment, the wireless communication circuitry 610 is assumed and described as being at least one heating element operating according to a first execution policy. A second execution policy may include a policy for increasing a data transfer rate and/or power for increasing the throughput of data higher than that of the first execution policy. As the wireless communication circuitry 610 operates according to the second execution policy under the control of the processor 680, performance of the wireless communication circuitry 610 can be improved.

In still another embodiment, the wireless power reception circuit 415, the charging circuit 650 and/or the battery 670 is assumed and described as being at least one heating element operating according to a first execution policy. A second execution policy may include a policy for increasing a charging current higher than that of the first execution policy. For example, the processor 680 may increase a charging current of the battery 670, for example, from 0.7 C to 1.0 C or from 1.0 C to 1.3 C, but the disclosure is not limited thereto. As the wireless power reception circuit 415 and/or the charging circuit 650 operates according to the second execution policy under the control of the processor 680, charging performance can be improved.

In an embodiment, when a change in the state of the electronic device 601 into the second state is not detected (e.g., NO at operation 740), the processor 680 may continuously control the at least one heating element, having the temperature higher than the designated temperature, to operate according to the first execution policy at operation 730.

The disclosure is not limited to such an embodiment. When a change in the state of the electronic device 601 into the second state is not detected (e.g., NO at operation 740), the processor 680 may perform operations 710, 720, and 730.

In various embodiments, although not illustrated, a state of the electronic device 601 may include a third state (e.g., an intermediate state). The third state of the electronic device 601 may mean a state between a first state (e.g., the closed state) of FIG. 2 and a second state (e.g., the open state) of FIG. 3. In an embodiment, when a state of the electronic device 601 is switched from the first state to the third state, the processor 680 may control at least one heating element to operate according to a third execution policy having higher performance than a first execution policy and having lower performance than a second execution policy.

Table 1 below according to various embodiments may arrange various scenarios for controlling an execution policy on which at least one heating element operates based on whether a temperature of the at least one heating element is higher than a designated temperature (e.g., a first designated temperature and a second designated temperature) depending on a state (e.g., a first state or a second state) of the electronic device 601.

TABLE 1

| | Designated temperature according to a state of electronic device | | |
| --- | --- | --- | --- |
| Heating element | First state (e.g., closed state in FIG. 2, slide-in) | Second state (e.g., open state in FIG. 3, slide-out) | An execution policy on which the heating element operates based on a state of the electronic device and a temperature of the heating element |
| AP | First designated temperature (e.g., about 40□) | Second designated temperature (e.g., about 45□) | When a state of the electronic device is the first state, when a temperature of the AP is higher than the first designated temperature, the AP is controlled to operate according to a first execution policy having lower performance than an execution policy now being executed (e.g., controlled to operate according to a policy for reducing a maximum clock of a CPU and/or a GPU and/or a frame per second (FPS)) When a state of the electronic device is changed into the second state, the AP is controlled to operate according to a second execution policy having higher performance than the first execution policy (e.g., controlled to operate according to a policy for increasing a maximum clock of a CPU and/or a GPU higher than that of the first |

TABLE 1-continued

| Heating element | Designated temperature according to a state of electronic device | | An execution policy on which the heating element operates based on a state of the electronic device and a temperature of the heating element |
| --- | --- | --- | --- |
| | First state (e.g., closed state in FIG. 2, slide-in) | Second state (e.g., open state in FIG. 3, slide-out) | |
| | | | execution policy and/or a frame per second (FPS)) When a state of the electronic device is the second state, when a temperature of the AP is higher than the second designated temperature, the AP is controlled to operate according to a third execution policy having higher performance than the first execution policy and having lower performance than the second execution policy |
| Wireless communication circuitry | First designated temperature (e.g., about 40□) | Second designated temperature (e.g., about 45□) | When a state of the electronic device is the first state, when a temperature of the wireless communication circuitry is higher than the first designated temperature, the wireless communication circuitry is controlled to operate according to a first execution policy having lower performance than an execution policy now being executed (e.g., controlled to operate according to a policy for reducing a data transfer rate and/or the power for reducing the throughput of data) When a state of the electronic device is changed into the second state, the wireless communication circuitry is controlled to operate according to a second execution policy having higher performance than the first execution policy (e.g., controlled to operate according to a policy for increasing a data transfer rate and/or power for increasing the throughput of data higher than that of the first execution policy) When a state of the electronic device is the second state, when a temperature of the wireless communication circuitry is higher than the second designated temperature, the wireless communication circuitry is controlled to operate according to a third execution policy having higher performance than the first execution policy and having lower performance than the second execution policy |
| Charging circuit (e.g., charging circuit and/or battery) | First designated temperature (e.g., about 40□) | Second designated temperature (e.g., about 45□) | When a state of the electronic device is the first state, when a temperature of the charging circuit is higher than the first designated temperature, the charging circuit is controlled to operate according to a first execution policy having lower performance than an execution policy now being executed (e.g., controlled to operate according to a policy for reducing a charging current (e.g., a policy for reducing a charging current from 1.3 C to 1.0 C or from 1.0 C to 0.7 C)) When a state of the electronic device is changed into the second state, the charging circuit is controlled to operate according to a second execution policy having higher performance than the first execution policy (e.g., controlled to operate according to a policy for increasing a charging current higher than that of the first execution policy (e.g., a policy for increasing a charging current from 0.7 C to 1.0 C or from 1.0 C to 1.3 C)) When a state of the electronic device is the second state, when a temperature of the charging circuit is higher than the second designated temperature, the charging circuit is controlled to operate according to the third execution policy having higher |

TABLE 1-continued

| | Designated temperature according to a state of electronic device | | |
|---|---|---|---|
| Heating element | First state (e.g., closed state in FIG. 2, slide-in) | Second state (e.g., open state in FIG. 3, slide-out) | An execution policy on which the heating element operates based on a state of the electronic device and a temperature of the heating element |
| | | | performance than the first execution policy and having lower performance than the second execution policy |

Figure 8:
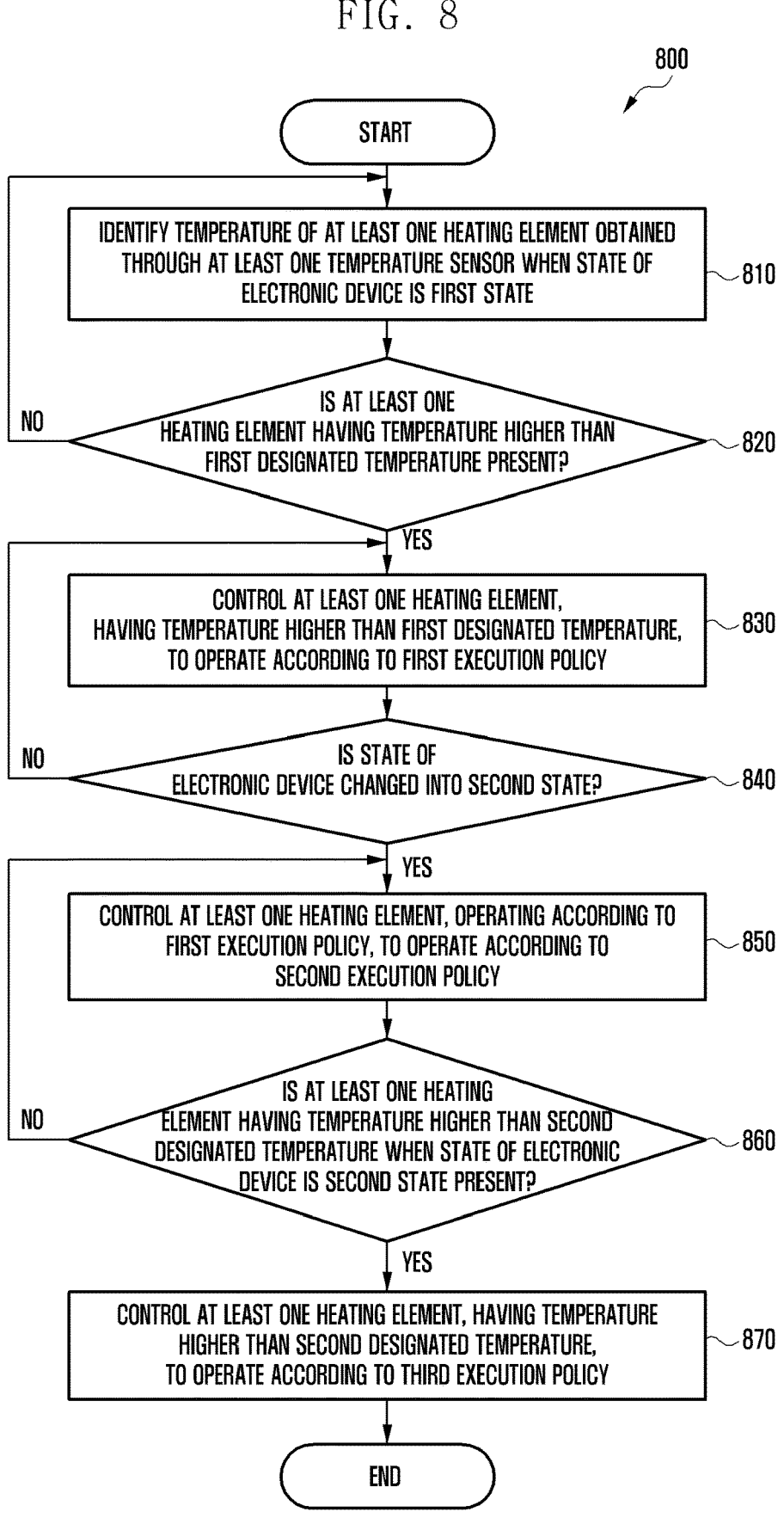
FIG. 8 is a flowchart for describing a method of controlling a temperature based on a state of an electronic device according to an embodiment of the disclosure.

FIG. 8 is a flowchart describing a method of controlling a temperature based on a state of an electronic device according to an embodiment of the disclosure.

Operations 810, 820, 830, 840, and 850 in FIG. 8 according to an embodiment are the same as operations 710, 720, 730, 740, and 750 in FIG. 7, and a detailed description thereof may be substituted with the description related to FIG. 7.

Referring to FIG. 8, illustrating flowchart 800, at operation 810, a processor (e.g., the processor 680 in FIG. 6) of an electronic device (e.g., the electronic device 601 in FIG. 6) may identify a temperature of at least one heating element obtained through at least one temperature sensor (e.g., the at least one temperature sensor 631 in FIG. 6) when a state of the electronic device 601 is a first state (e.g., the closed state in FIG. 2). The at least one heating element may include at least one of an AP (e.g., the processor 680 in FIG. 6), communication circuitry (e.g., the wireless communication circuitry 610 in FIG. 6), a charging circuit (e.g., the charging circuit 650 in FIG. 6), or a connection terminal (e.g., the connection terminal 660 in FIG. 6). In an embodiment, the at least one temperature sensor 631 may be disposed adjacent to each of at least one heating element or may be included in each of the at least one heating element. The processor 680 may identify a temperature of at least one heating element obtained through the at least one temperature sensor 631 (e.g., the first temperature sensor 413, the second temperature sensor 445, the third temperature sensor 455, the fourth temperature sensor 460 and/or the fifth temperature sensor 475 in FIGS. 4A, 4B, and 4C) disposed adjacent to each of at least one heating element.

In an embodiment, at operation 820, the processor 680 may identify whether at least one heating element having a temperature higher than a first designated temperature is present. When the at least one heating element having the temperature higher than the first designated temperature is present (e.g., YES at operation 820), at operation 830, the processor 680 may control the at least one heating element, having the temperature higher than the first designated temperature, to operate according to a first execution policy. For example, the processor 680 may control the at least one heating element to operate according to the first execution policy having lower performance than an execution policy for a function of at least one heating element, which is now being executed, so that the temperature of the at least one heating element higher than the first designated temperature is lowered.

In an embodiment, when at least one heating element having the temperature higher than the first designated temperature is not present (e.g., NO at operation 820), the processor 680 may identify a temperature of at least one heating element obtained through the at least one temperature sensor at operation 810.

In an embodiment, at operation 840, the processor 680 may identify whether a state of the electronic device 601 is changed into a second state (e.g., the open state in FIG. 3). When a state of the electronic device 601 is changed into the second state (e.g., YES at operation 840), at operation 850, the processor 680 may control at least one heating element, operating according to the first execution policy, to operate according to a second execution policy. For example, when the state of the electronic device 601 is changed into the second state, a temperature of the at least one heating element may be lowered. The processor 680 may control the at least one heating element to operate according to the second execution policy having higher performance than the first execution policy.

In an embodiment, when a change in the state of the electronic device 601 into the second state is not detected (e.g., NO at operation 840), the processor 680 may continuously control the at least one heating element, having the temperature higher than the first designated temperature, to operate according to the first execution policy at operation 830, but the disclosure is not limited thereto. When a change in the state of the electronic device 601 into the second state is not detected (e.g., NO at operation 840), the processor 680 may repeatedly perform operations 810, 820, and 830.

In an embodiment, at operation 860, the processor 680 may identify whether at least one heating element having a temperature higher than a second designated temperature is present when a state of the electronic device 601 is the second state. When at least one heating element having the temperature higher than the second designated temperature is present (e.g., YES at operation 860), at operation 870, the processor 680 may control the at least one heating element, having the temperature higher than the second designated temperature, to operate according to the third execution policy.

In an embodiment, the second designated temperature may be higher than the first designated temperature at operation 820. If a temperature of at least one heating element rises even when a state of the electronic device 601 is the second state, the processor 680 may control the at least one heating element to operate according to an execution policy for limiting the generation of heat. For example, the processor 680 may control the at least one heating element, having the temperature higher than the second designated temperature when a state of the electronic device 601 is the second state, to operate according to a third execution policy having lower performance than the second execution policy for a function of the at least one heating element, which is now being executed, so that the temperature of the at least one heating element is lowered. In an embodiment, the third execution policy may be a policy having higher performance than the first execution policy at operation 830.

In an embodiment, when at least one heating element having a temperature higher than the second designated temperature is not present (e.g., NO at operation 860), the processor 680 may continuously control the at least one heating element, operating according to the first execution policy, to operate according to the second execution policy at operation 850.

Figure 9:
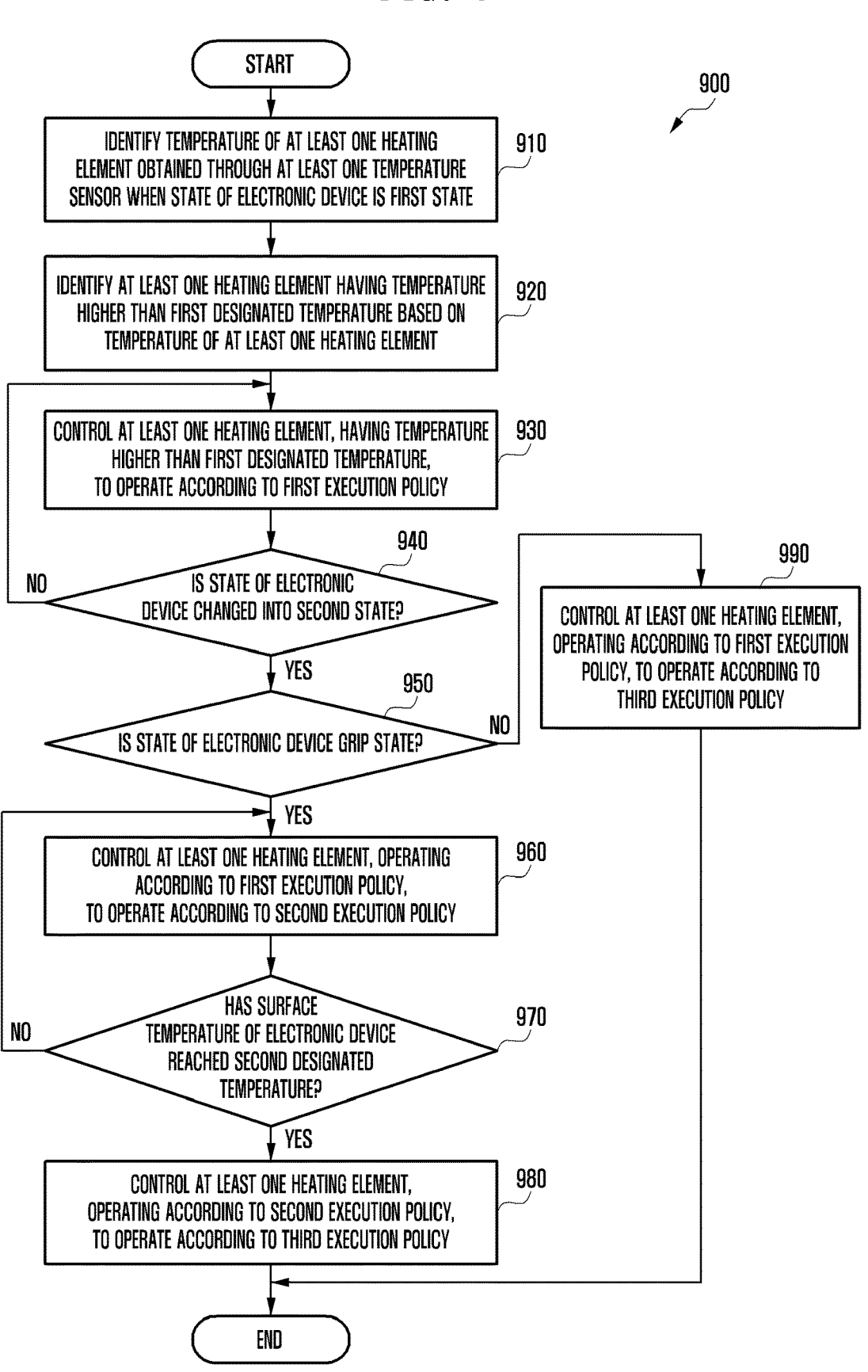
FIG. 9 is a flowchart for describing a method of controlling a temperature based on a state of an electronic device according to an embodiment of the disclosure.

FIG. 9 is a flowchart describing a method of controlling a temperature based on a state of an electronic device according to an embodiment of the disclosure.

In various embodiments, if a temperature of at least one heating element rises when a state of an electronic device (e.g., the electronic device 601 in FIG. 6) is a first state (e.g., the closed state in FIG. 2), heat generated from the at least one heating element may not be discharged due to a sealing insulation effect of a support member assembly (e.g., a second support member (e.g., the second support member 425 in FIGS. 4A, 4B, and 4C) or a third support member (e.g., the third support member 405 in FIGS. 4A and 4C)) and a back cover (not illustrated). When a state of the electronic device is changed from the first state to a second state (e.g., the open state in FIG. 3), a surface temperature of the electronic device 601 may rapidly rise to a designated temperature as the heat sealed by the back cover (not illustrated) is discharged. Accordingly, heat dissipation performance felt by a user may be low.

An embodiment in which at least one heating element is controlled to operate according to a different execution policy based on a heat discharge characteristic when a state of the electronic device 601 is switched from a first state to a second state in addition to a state (e.g., the first state and the second state) of the electronic device 601 and a temperature of the at least one heating element is described below with reference to FIG. 9.

Operations 910, 920, 930, and 940 in FIG. 9 according to an embodiment are the same as operations 710, 720, 730, and 740 in FIG. 7, and a detailed description thereof may be substituted with the description related to FIG. 7.

Referring to FIG. 9, illustrating flowchart 900, at operation 910, a processor (e.g., the processor 680 in FIG. 6) of the electronic device 601 may identify a temperature of at least one heating element obtained through at least one temperature sensor (e.g., the at least one temperature sensor 631 in FIG. 6) when a state of the electronic device 601 is a first state (e.g., the closed state in FIG. 2). The at least one heating element may include at least one of an AP (e.g., the processor 680 in FIG. 6), communication circuitry (e.g., the wireless communication circuitry 610 in FIG. 6), a charging circuit (e.g., the charging circuit 650 in FIG. 6), or a connection terminal (e.g., the connection terminal 660 in FIG. 6). In an embodiment, the at least one temperature sensor 631 may be disposed adjacent to each of at least one heating element or may be included in each of the at least one heating element.

In an embodiment, at operation 920, the processor 680 may identify at least one heating element having a temperature higher than a first designated temperature based on the temperature of the at least one heating element. At operation 930, the processor 680 may control the at least one heating element, having the temperature higher than the first designated temperature, to operate according to a first execution policy. For example, the processor 680 may control the at least one heating element, having the temperature higher than the first designated temperature, to operate according to the first execution policy having lower performance than an execution policy for a function of the at least one heating element, which is now being executed, so that the temperature of the at least one heating element is lowered.

In an embodiment, at operation 940, the processor 680 may identify whether the first state of the electronic device 601 is switched to a second state (e.g., the open state in FIG. 3).

In an embodiment, when a change in the state of the electronic device 601 into the second state is not detected (e.g., NO at operation 940), the processor 680 may control the at least one heating element, having the temperature higher than the first designated temperature, to operate according to the first execution policy at operation 930, but the disclosure is not limited thereto. When a change in the state of the electronic device 601 into the second state is not detected (e.g., NO at operation 940), the processor 680 may repeatedly perform operations 910, 920, and 930.

In an embodiment, when the state of the electronic device 601 is switched to the second state (e.g., YES at operation 940), at operation 950, the processor 680 may identify whether a state of the electronic device 601 is the grip state. For example, the electronic device 601 may include at least one grip sensor (e.g., the at least one grip sensor 633 in FIG. 6) connected to a path for discharging heat generated by the at least one heating element and/or the at least one temperature sensor 631 disposed adjacent to the path for discharging heat. The processor 680 may identify whether a state of a user is the state in which the user has gripped the electronic device 601 (or the state in which the user has touched the electronic device 601) based on the at least one grip sensor 633 and/or the at least one temperature sensor 631.

An embodiment related to the at least one grip sensor 633 connected to the path for discharging heat generated by the at least one heating element and/or the at least one temperature sensor 631 disposed adjacent to the path for discharging heat will be described in detail with reference to FIG. 11.

In an embodiment, when the state of the electronic device 601 is the grip state (e.g., YES at operation 950), at operation 960, the processor 680 may control the at least one heating element, operating according to the first execution policy, to operate according to a second execution policy. For example, the second execution policy may include a policy for changing performance at designated time intervals within a designated performance range and controlling the at least one heating element to operate with the changed performance. For example, if the designated performance range is 60% to 80%, the second execution policy may include a policy for controlling the at least one heating element to repeatedly operate at designated time intervals, for example, with performance of 80%, performance of 70% and/or performance of 60%. As the at least one heating element is controlled to operate according to the second execution policy, a surface temperature of the electronic device 601 may have a gentle temperature rise rate.

In an embodiment, at operation 970, the processor 680 may identify whether a surface temperature of the electronic device 601 reaches a second designated temperature. For example, the processor 680 may obtain a surface temperature of the electronic device 601 from the at least one temperature sensor 631 disposed adjacent to the path for discharging heat.

In an embodiment, when a state of the electronic device 601 is changed from the first state to the second state, a surface temperature of the electronic device 601 may rapidly rise to a second designated temperature due to a heat discharge characteristic. After timing at which the surface temperature reaches the second designated temperature, the surface temperature of the electronic device 601 may converge low. In order to determine whether to change the second execution policy on which the at least one heating element operates based on whether the surface temperature of the electronic device 601 reaches the converging second designated temperature, the processor 680 may perform operation 970.

In an embodiment, as the at least one heating element operates according to the second execution policy, when the surface temperature of the electronic device 601 reaches the second designated temperature (e.g., YES at operation 970), at operation 980, the processor 680 may control the at least one heating element, operating according to the second execution policy, to operate according to a third execution policy. The third execution policy may include a policy having higher performance than the first execution policy.

In an embodiment, when the surface temperature of the electronic device 601 does not reach the second designated temperature (e.g., NO at operation 970), the processor 680 may continuously control the at least one heating element, operating according to the first execution policy, to operate according to the second execution policy at operation 960.

In an embodiment, when the state of the electronic device 601 is not the grip state at operation 950 (e.g., NO at operation 950), at operation 990, the processor 680 may control the at least one heating element, operating according to the first execution policy, to operate according to a third execution policy. The third execution policy may include a policy having higher performance than the first execution policy.

A method of controlling a temperature according to a state of the electronic device 601 including the flexible display 640 according to various embodiments may include an operation of obtaining a temperature of at least one heating element through the at least one temperature sensor 631 disposed adjacent to the at least one heating element when a state of the electronic device 601 is a first state, an operation of identifying at least one heating element having a temperature higher than a designated temperature based on the obtained temperature of the at least one heating element, and an operation of controlling the at least one heating element, having the temperature higher than the designated temperature, to operate according to a first execution policy. The first state may include the state in which at least a part of the bendable section of the flexible display 640 enters the internal space of the housing 210 due to a slide-in of the sliding plate 220 capable of sliding out from the housing 210.

According to various embodiments, the at least one heating element may include at least one of the processor 680, the wireless communication circuitry 610, the charging circuit 650, the battery 670, or the connection terminal 660.

A method of controlling a temperature according to a state of the electronic device 601 including the flexible display 640 according to various embodiments may further include an operation of controlling at least one heating element, operating according to a first execution policy, to operate according to a second execution policy when a change in the state of the electronic device 601 from the first state to the second state is detected.

According to various embodiments, the second state may include the state in which at least a part of the bendable section of the flexible display 640 is drawn from the internal space of the housing 210 due to a slide-out of the sliding plate 220 capable of sliding out from the housing 210. The second execution policy may include a policy having higher performance than the first execution policy.

A method of controlling a temperature according to a state of the electronic device 601 including the flexible display 640 according to various embodiments may further include an operation of obtaining a temperature of at least one heating element through the at least one temperature sensor 631 in the second state, an operation of identifying at least one heating element having a temperature higher than a second designated temperature based on the obtained temperature of the at least one heating element, and an operation of controlling the at least one heating element, having the temperature higher than the second designated temperature, to operate according to a third execution policy.

According to various embodiments, the third execution policy may include a policy having lower performance than the second execution policy and having higher performance than the first execution policy.

A method of controlling a temperature according to a state of the electronic device 601 including the flexible display 640 according to various embodiments may further include an operation of identifying the grip state of the electronic device 601 when a change in the state of the electronic device 601 from the first state to the second state is detected.

According to various embodiments, the operation of identifying the grip state of the electronic device 601 may include an operation of identifying the grip state of the electronic device 601 based on the at least one grip sensor 633 connected to a heat discharge path of the at least one heating element and/or the at least one temperature sensor 631 disposed in the heat discharge path of the at least one heating element.

A method of controlling a temperature according to a state of the electronic device 601 including the flexible display 640 according to various embodiments may further include an operation of controlling at least one heating element, operating according to the first execution policy, to operate according to a third execution policy when a state of the electronic device 601 is identified to be the grip state.

According to various embodiments, the third execution policy may include a policy for changing performance at designated time intervals within a designated performance range and controlling the at least one heating element to operate with the changed performance.

According to various embodiments, the operation of controlling the at least one heating element to operate according to the third execution policy may include an operation of obtaining a surface temperature of the electronic device 601 through the at least one temperature sensor 631 disposed in a heat discharge path of the at least one heating element and an operation of controlling the at least one heating element to operate according to the third execution policy until the surface temperature of the electronic device 601 reaches a third designated temperature.

A method of controlling a temperature according to a state of the electronic device 601 including the flexible display 640 according to various embodiments may further include an operation of controlling at least one heating element, operating according to the first execution policy, to operate according to the second execution policy when a state of the electronic device 601 is identified to be not the grip state.

A method of controlling a temperature according to a state of the electronic device 601 including the flexible display 640 according to various embodiments may further include an operation of displaying a notification message related to an execution policy controlled based on a state of the electronic device 601 or a notification message for inducing the use of the electronic device 601 in the second state when the at least one heating element operates according to the first execution policy.

Figure 10:
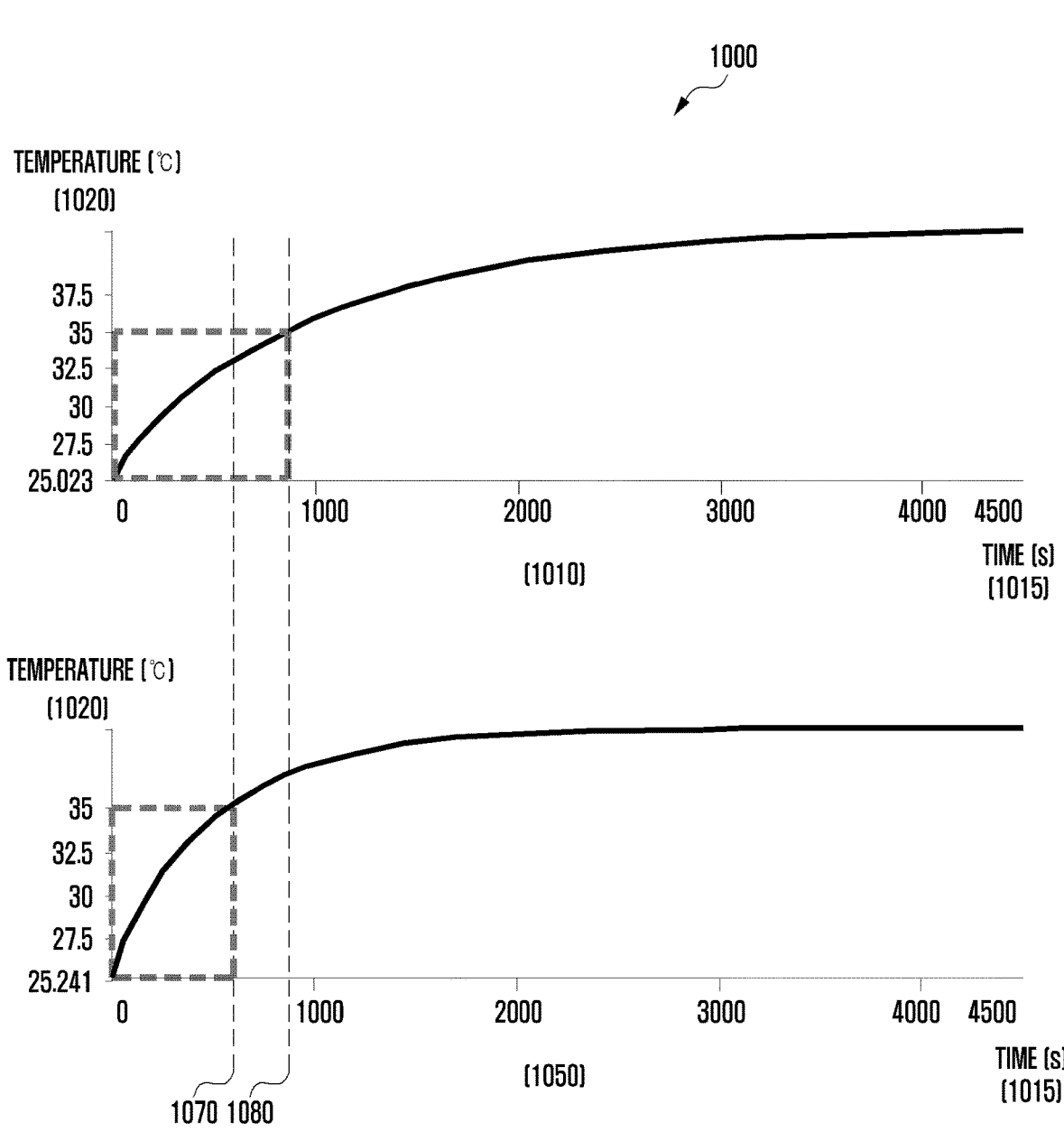
FIG. 10 is a diagram for describing a change in temperature of an electronic device when a state of the electronic device is changed into a second state according to an embodiment of the disclosure.

FIG. 10 is a diagram describing a change in temperature of an electronic device when a state of the electronic device is changed into a second state according to an embodiment of the disclosure.

Referring to FIG. 10, illustrating diagram 1000, an x axis may mean a time 1015. A y axis may mean a surface temperature 1020 of an electronic device (e.g., the electronic device 601 in FIG. 6). As illustrated in reference numeral <1010>, a time 1080 taken for a surface temperature of the electronic device 601 to reach a designated temperature, for example, about 35° C. when a state of the electronic device 601 is a first state (e.g., the closed state in FIG. 2) may be about 874 seconds. As illustrated in reference numeral <1050>, when a state of the electronic device 601 is changed from the first state to a second state (e.g., the open state in FIG. 3), a time 1070 taken for a surface temperature of the electronic device 601 to reach a designated temperature, for example, about 35° C. may be about 593 seconds. The aforementioned designated temperature and the time taken for the surface temperature of the electronic device 601 to reach the designated temperature are examples for easily describing an operation, and the disclosure is not limited to the aforementioned numerical values.

As described above, the time 1070 taken for a surface temperature of the electronic device 601 to reach a designated temperature, for example, about 35° C. when a state of the electronic device 601 is changed from the first state to a second state (e.g., the open state in FIG. 3) may be shorter than the time 1080 taken for a surface temperature of the electronic device 601 to reach a designated temperature, for example, about 35° C. when a state of the electronic device 601 is a first state (e.g., the closed state in FIG. 2). Accordingly, when a state of the electronic device 601 is changed from the first state to the second state, if a state of a user is the state in which the user has gripped (or touched) the electronic device 601, the user can recognize a heating state of the electronic device 601 because a surface temperature of the electronic device 601 rapidly rise (or suddenly rises). Accordingly, an experience of generation of heat felt by the user who has recognized the heating state can be reduced.

In various embodiments, when a state of the electronic device 601 is switched from a first state to a second state, if a state of a user is the state in which the user has gripped (or touched) the electronic device 601, the electronic device 601 may control an operation signal of at least one heating element so that a surface temperature of the electronic device 601 may have a gentle temperature rise rate. For example, the electronic device 601 may control at least one heating element, operating according to the first execution policy, to operate according to the second execution policy at operation 960 in FIG. 9.

In relation to the operation of controlling an operation signal of at least one heating element so that a surface temperature of the electronic device 601 may have a gentle temperature rise rate, various embodiments will be described with reference to FIG. 12 to be described later.

Figure 11:
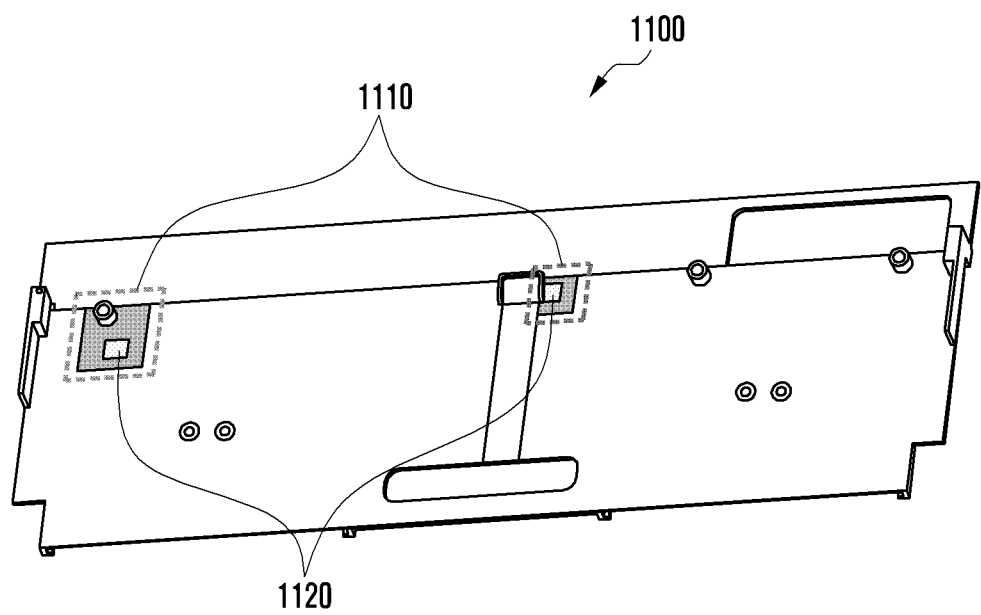
FIG. 11 is a diagram for describing a method of identifying a grip state of an electronic device after a state of the electronic device is changed into a second state according to an embodiment of the disclosure.

FIG. 11 is a diagram describing a method of identifying a grip state of an electronic device after a state of the electronic device is changed into the second state according to an embodiment of the disclosure.

Referring to FIG. 11, illustrating diagram 1100, a hotspot area adjacent to at least one heating element (e.g., an AP (e.g., the processor 680 in FIG. 6)), communication circuitry (e.g., the wireless communication circuitry 610 in FIG. 6), a charging circuit (e.g., the charging circuit 650 in FIG. 6) and/or a connection terminal (e.g., the connection terminal 660 in FIG. 6) may be formed in an electronic device (e.g., the electronic device 601 in FIG. 6). For example, a hotspot area may be formed in a path for discharging heat generated by at least one heating element. The electronic device 601 may include at least one grip sensor 1110 (e.g., the at least one grip sensor 633 in FIG. 6) connected to a path (e.g., a hotspot area) for discharging heat generated by at least one heating element and/or at least one temperature sensor 1120 (e.g., the at least one temperature sensor 631 in FIG. 6) disposed adjacent to a path (e.g., a hotspot area) for discharging heat. The electronic device 601 may identify whether a state of a user is the state in which the user has gripped the electronic device 601 (or the state in which the user has touched the electronic device 601 as the user grips the electronic device 601) based on the at least one grip sensor 1110 and/or the at least one temperature sensor 1120.

In an embodiment, when it is identified that the state of the user is the state in which the user has gripped the electronic device 601 (or the state in which the user has touched the electronic device 601 as the user grips the electronic device 601) based on the at least one grip sensor 1110 and/or the at least one temperature sensor 1120, the electronic device 601 may control at least one heating element, operating according to the first execution policy, to operate according to the second execution policy at operation 960 in FIG. 9.

Figure 12:
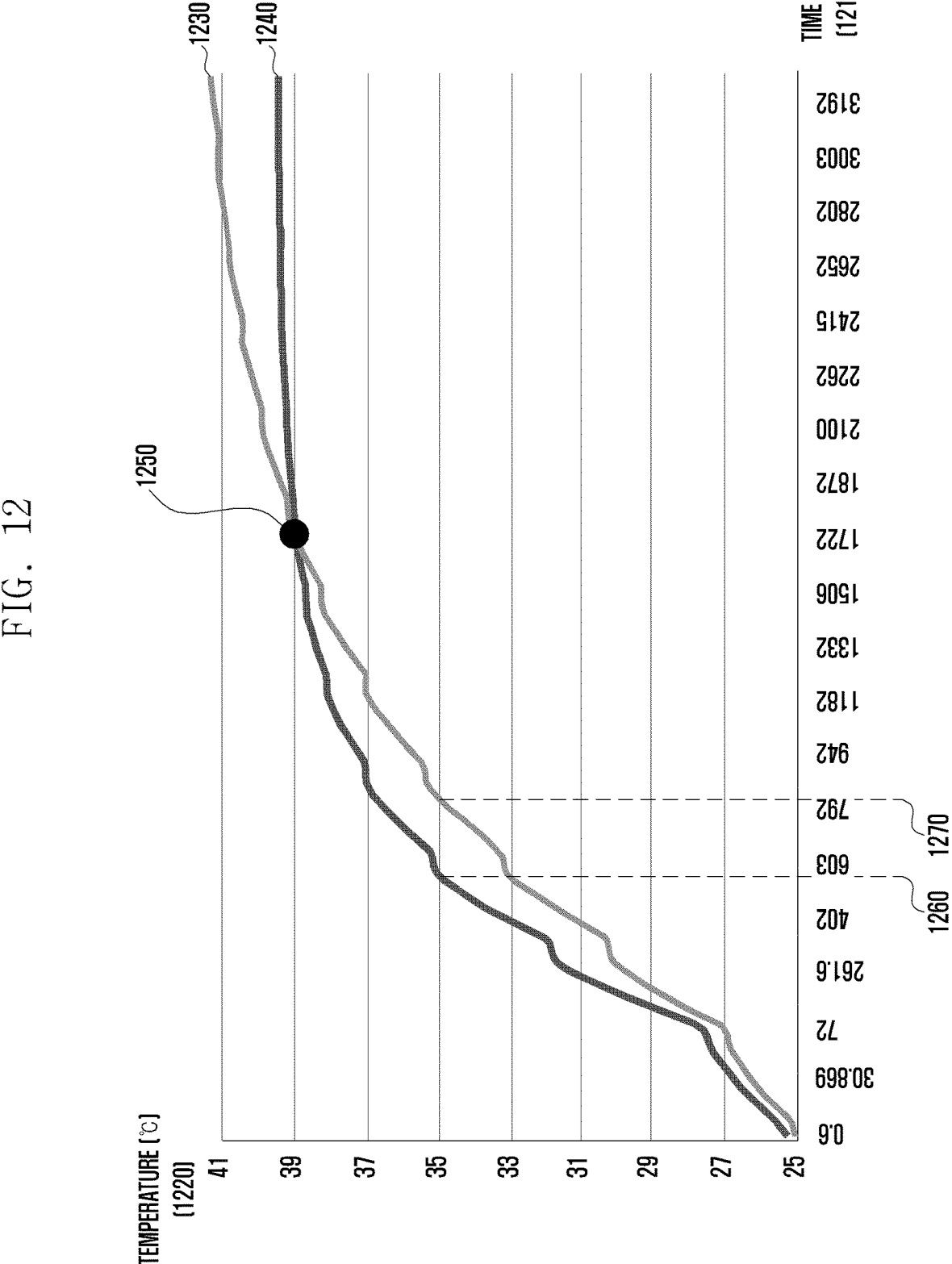
FIG. 12 is a diagram for describing a method of controlling at least one heating element based on a state of an electronic device identified to be a second state and a grip state according to an embodiment of the disclosure.

FIG. 12 is a diagram describing a method of controlling at least one heating element based on a state of an electronic device identified to be a second state and a grip state according to an embodiment of the disclosure.

Referring to FIG. 12, an x axis may mean a time 1210. A y axis may mean a surface temperature 1220 of an electronic device (e.g., the electronic device 601 in FIG. 6). As described with reference to FIG. 10, a time 1260 taken for a surface temperature of the electronic device 601 to reach a specific temperature, for example, about 35° C. in the state in which a state of the electronic device 601 has been changed from the first state to a second state 1240 (e.g., the open state in FIG. 3) may be shorter than a time 1270 taken for a surface temperature of the electronic device 601 to reach a specific temperature, for example, about 35° C. when a state of the electronic device 601 is a first state 1230 (e.g., the closed state in FIG. 2). When a surface temperature of the electronic device 601 rapidly rises (or suddenly rises), heat dissipation performance may be reduced, and an experience of generation of heat felt by a user who has recognized a heating state when the user grips the electronic device 601 may be reduced.

In an embodiment, when a change in the state of the electronic device 601 from the first state 1230 (e.g., the closed state in FIG. 2) to the second state 1240 (e.g., the open state in FIG. 3) is detected and a state of a user is the state in which the user has gripped the electronic device 601, the electronic device 601 may control an operation signal of at least one heating element until a surface temperature of the electronic device 601 reaches a designated temperature 1250. For example, the electronic device 601 may control the at least one heating element, operating according to the first execution policy, to operate according to the second execution policy at operation 960 in FIG. 9.

In an embodiment, a surface temperature of the electronic device 601 may be obtained through at least one temperature sensor (e.g., the at least one temperature sensor 1120 in FIG. 11) disposed adjacent to a path (e.g., a hotspot area) for discharging heat generated by at least one heating element. The electronic device 601 may control an operation signal of a function associated with at least one heating element so that a surface temperature of the electronic device 601 has a gentle temperature rise rate.

For example, the electronic device 601 may control an operation signal of at least one heating element so that the at least one heating element operates within a designated performance range until a surface temperature of the electronic device 601 reaches the designated temperature 1250. When a state of the electronic device 601 is changed from a first state to a second state, a surface temperature of the electronic device 601 may rapidly rise to the designated temperature 1250 due to a heat discharge characteristic, and may converge low after timing at which the surface temperature reaches the designated temperature 1250. Based on such a characteristic, the electronic device 601 may control an operation of at least one heating element so that the at least one heating element operates within a designated performance range up to the designated temperature 1250 at which a surface temperature of the electronic device 601 converges low. For example, when the designated performance range is 60% to 80%, the electronic device 601 may control at least one heating element to repeatedly operate at designated time intervals, for example, with performance of 80%, with performance of 70% and/or with performance of 60% until a surface temperature of the electronic device 601 reaches the designated temperature 1250. As at least one heating element is controlled to operate according to a second execution policy, a surface temperature of the electronic device 601 may have a gentle temperature rise rate. Accordingly, while performance degradation of an operation associated with the at least one heating element is decreased, a surface temperature of the electronic device 601 can be controlled to slowly rise.

In an embodiment, after a surface temperature of the electronic device 601 reaches the designated temperature 1250, the electronic device 601 may control the at least one heating element, operating according to the second execution policy, to operate according to the third execution policy at operation 980 in FIG. 9. After a state of the electronic device 601 is changed into the second state and a surface temperature of the electronic device 601 reaches the designated temperature 1250 at which the surface temperature converges low, the electronic device 601 controls the at least one heating element to operate according to the third execution policy. A rise in surface temperature of the electronic device 601 may become gentle.

Figure 13:
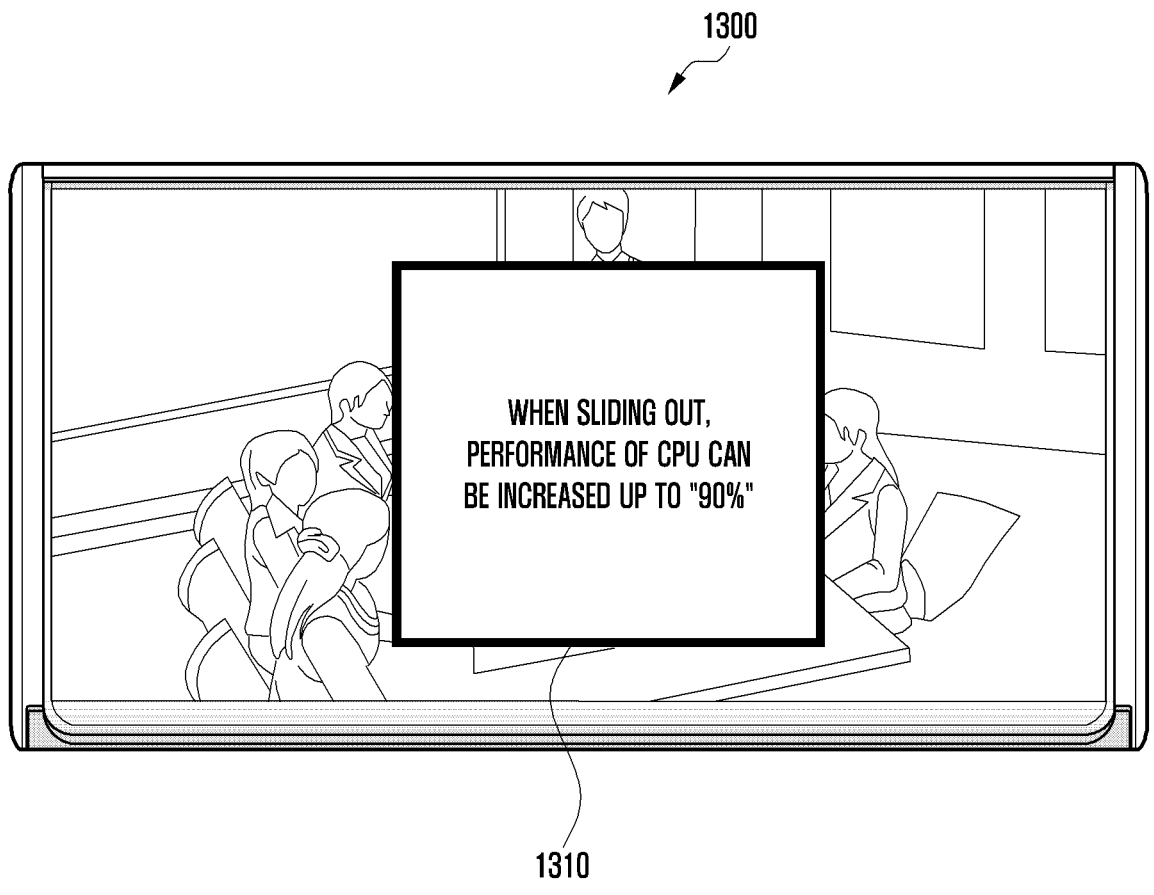
FIG. 13 is a diagram for describing a notification message outputted based on a state of an electronic device according to an embodiment of the disclosure.

FIG. 13 is a diagram describing outputting a notification message based on a state of an electronic device according to an embodiment of the disclosure.

Referring to FIG. 13, illustrating diagram 1300, when a temperature of at least one heating element (e.g., an AP) related to a specific function (e.g., image output) is higher than a designated temperature because an electronic device (e.g., the electronic device 601 in FIG. 6) executes the specific function in a first state (e.g., the closed state in FIG. 2), a processor (e.g., the processor 680 in FIG. 6) of the electronic device 601 may display, on a display (e.g., the display 641 FIG. 6), a notification message for causing the specific function to be executed in a second state (e.g., the open state in FIG. 3). For example, the processor 680 may display a notification message for causing a change into a second state so that the electronic device 601 may execute a specific function having heat discharge efficiency better than that in a first state with high performance. For example, the processor 680 may display, on the display 641, a notification message 1310 including "when sliding out, performance of a CPU can be increased up to '90%'."

The disclosure is not limited to such an embodiment. If a temperature of at least one heating element is higher than a designated temperature when a state of the electronic device 601 is a first state, the processor 680 may display a notification message for a changed execution policy on the display 641. For example, the processor 680 may display, on the display 641, a notification message including "performance of a CPU is limited to '60%'."

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., through wires), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:
1. An electronic device comprising:
a housing;
a plate slidable from the housing in a first direction and a second direction opposite to the first direction;
a flexible display including a bendable area that can be inserted into an internal space of the housing;
a sensor circuit;
at least one temperature sensor disposed on the housing;
a memory storing one or more heat-related execution policies; and
a processor operatively coupled to the sensor circuit, the at least one temperature sensor, and the memory,
wherein the memory stores instructions that, when executed by the processor, cause the electronic device to:
obtain, via the at least one temperature sensor, information related to a first temperature in a first state in which the bendable area of the flexible display is inserted into the internal space of the housing,

in case that the first temperature is higher than a first designated temperature, control at least one heating element to a first execution policy, and
in response to detecting via the sensor circuit that a state of the electronic device has changed from the first state to a second state in which the bendable area of the flexible display is drawn out from the internal space of the housing, control the at least one heating element operating according to the first execution policy to operate according to a second execution policy,
wherein the second execution policy comprises a policy having a higher performance than the first execution policy.
2. The electronic device of claim 1, wherein the at least one heating element comprises at least one of an application processor (AP), communication circuitry, a charging circuit, a battery, or a connection terminal.
3. The electronic device of claim 2,
wherein, based on the at least one heating element being the AP, the first execution policy comprises a policy for at least one of reducing a maximum clock of a central processor unit (CPU) included in the AP, reducing a maximum clock of a graphics processing unit (GPU) included in the AP, or reducing a frame per second (FPS), and a second execution policy comprises a policy for at least one of increasing the maximum clock of the CPU to be higher than a maximum clock of the first execution policy, increasing the maximum clock of the GPU to be higher than the maximum clock of the first execution policy, or increasing the FPS to be higher than an FPS of the first execution policy,
wherein, based on the at least one heating element being the communication circuitry, the first execution policy comprises a policy for at least one of reducing a data transfer rate or reducing power, and the second execution policy comprises a policy for at least one of increasing the data transfer rate to be higher than a data transfer rate of the first execution policy, or increasing the power to be higher than the power of the first execution policy, and
wherein, based on the at least one heating element being at least one of the charging circuit, the battery, or the connection terminal, the first execution policy comprises a policy for lowering a charging current and the second execution policy comprises a policy for increasing the charging current to be higher than a charging current of the first execution policy.
4. The electronic device of claim 1,
wherein the instructions, when executed by the processor, further cause the electronic device to:
obtain information related to a second temperature through the at least one temperature sensor in the second state, and
in case that the second temperature is higher than a second designated temperature, control the at least one heating element to operate according to a third execution policy, and
wherein the third execution policy comprises a policy having a lower performance than the second execution policy and a higher performance than the first execution policy.
5. The electronic device of claim 1, wherein the instructions, when executed by the processor, further cause the electronic device to, in response to detecting the electronic device changing from the first state to the second state, identify a grip state of the electronic device.

6. The electronic device of claim 5, wherein the instructions, when executed by the processor, further cause the electronic device to identify the grip state of the electronic device based on one of at least one grip sensor connected to a heat discharge path of the at least one heating element or the at least one temperature sensor disposed in the heat discharge path of the at least one heating element.

7. The electronic device of claim 6, wherein the instructions, when executed by the processor, further cause the electronic device to:

in response to identifying that the state of the electronic device is the grip state, control the at least one heating element operating according to the first execution policy to operate according to a third execution policy, and in response to identifying that the state of the electronic device is not the grip state, control the at least one heating element operating according to the first execution policy to operate according to the second execution policy, and wherein the third execution policy comprises a policy for changing performance at designated time intervals within a designated performance range and controlling the at least one heating element to operate with the changed performance.

8. The electronic device of claim 7, wherein the instructions, when executed by the processor, further cause the electronic device to:

identify a surface temperature of the electronic device through the at least one temperature sensor in the heat discharge path of the at least one heating element, and control the at least one heating element to operate according to the third execution policy until the identified surface temperature of the electronic device reaches a third designated temperature.

9. The electronic device of claim 1, wherein the instructions, when executed by the processor, further cause the electronic device to, while the at least one heating element operates according to the first execution policy, control the flexible display to display a notification message related to an execution policy controlled based on a state of the electronic device or a notification message for inducing use of the electronic device in the second state.

10. A method of controlling a temperature according to a state of an electronic device comprising a flexible display, the method comprising:

obtaining, via at least one temperature sensor, information related to a first temperature in a first state in which a bendable area of a flexible display is inserted into an internal space of a housing;

in case the first temperature is higher than a first designated temperature, controlling at least one heating element to a first execution policy; and in response to detecting via a sensor circuit that a state of the electronic device has changed from the first state to a second state in which the bendable area of the flexible display is drawn out from the internal space of the housing, controlling the at least one heating element operating according to the first execution policy to operate according to a second execution policy, wherein the second execution policy comprises a policy having a higher performance than the first execution policy.

11. The method of claim 10, further comprising:

while the electronic device is in the second state, obtaining information related to a second temperature through the at least one temperature sensor; and in case that the second temperature is higher than a second designated temperature, control the at least one heating element to operate according to a third execution policy, wherein the third execution policy comprises a policy having a lower performance than the second execution policy and a higher performance than the first execution policy.

12. The method of claim 10, further comprising:

in response to detecting a change in the state of the electronic device from the first state to a second state, identifying whether the electronic device is in a grip state.

13. The method of claim 12, further comprising identifying the electronic device as being in the grip state based on one of at least one grip sensor connected to a heat discharge path of the at least one heating element or the at least one temperature sensor disposed in the heat discharge path of the at least one heating element.

14. The method of claim 13, further comprising:

in response to identifying that the state of the electronic device is the grip state, controlling the at least one heating element operating according to the first execution policy to operate according to a third execution policy; and in response to identifying that the state of the electronic device is not the grip state, controlling the at least one heating element operating according to the first execution policy to operate according to a second execution policy, wherein the third execution policy comprises a policy for changing performance at designated time intervals within a designated performance range and controlling the at least one heating element to operate with the changed performance.

15. The method of claim 14, wherein the controlling of the at least one heating element to operate according to the third execution policy comprises:

identifying a surface temperature of the electronic device through the at least one temperature sensor in the heat discharge path of the at least one heating element; and controlling the at least one heating element to operate according to the third execution policy until the identified surface temperature of the electronic device reaches a third designated temperature.

16. The method of claim 10, further comprising, in response to the at least one heating element operating according to the first execution policy, displaying a notification message related to an execution policy controlled based on the state of the electronic device or displaying a notification message for inducing use of the electronic device in a second state.

17. The method of claim 10, wherein, based on the at least one heating element being an application processor (AP), the first execution policy comprises a policy for at least one of reducing a maximum clock of a central processor unit (CPU) included in the AP, reducing a maximum clock of a graphics processing unit (GPU) included the in AP, or reducing a frame per second (FPS), and a second execution policy comprises a policy for at least one of increasing the maximum clock of the CPU to be higher than a maximum clock of the first execution policy, increasing the maximum clock of the GPU to be higher than the maximum clock of the first execution policy, or increasing the FPS to be higher than an FPS of the first execution policy, wherein, based on the at least one heating element being communication circuitry, the first execution policy comprises a policy for at least one of reducing a data transfer rate or reducing power, and the second execution policy comprises a policy for at least one of increasing the data transfer rate to be higher than a data transfer rate of the first execution policy, or increasing the power to be higher than the power of the first execution policy, and wherein, based on the at least one heating element being at least one of a charging circuit, a battery, or a connection terminal, the first execution policy comprises a policy for lowering a charging current and the second execution policy comprises a policy for increasing the charging current to be higher than a charging current of the first execution policy.

18. A non-transitory computer-readable medium storing instructions executable by a processor of an electronic device, wherein execution of the instructions by the processor causes the processor to perform a plurality of operations comprising:

obtaining, via at least one temperature sensor, information related to a first temperature in a first state in which a bendable area of a flexible display is inserted into an internal space of a housing;

in case the first temperature is higher than a first designated temperature, controlling at least one heating element to a first execution policy; and in response to detecting via a sensor circuit that a state of the electronic device has changed from the first state to a second state in which the bendable area of the flexible display is drawn out from the internal space of the housing, controlling the at least one heating element operating according to the first execution policy to operate according to a second execution policy, wherein the second execution policy comprises a policy having a higher performance than the first execution policy.

* * * * *